(12) United States Patent
Mizoguchi et al.

(10) Patent No.: US 6,414,564 B1
(45) Date of Patent: Jul. 2, 2002

(54) DISTRIBUTED CONSTANT ELEMENT USING A MAGNETIC THIN FILM

(75) Inventors: Tetsuhiko Mizoguchi; Tetsuo Inoue, both of Yokohama; Toshirou Sato, Nagano, all of (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/630,542

(22) Filed: Aug. 1, 2000

Related U.S. Application Data

(62) Division of application No. 09/115,236, filed on Jul. 14, 1998, now Pat. No. 6,121,852.

(30) Foreign Application Priority Data

Jul. 15, 1997 (JP) ............................................. 9-190118
Oct. 9, 1997 (JP) ............................................. 9-277724

(51) Int. Cl.[7] .............................. H03H 7/38; H03H 7/09; H01F 27/06; G01R 33/02
(52) U.S. Cl. ...................... 333/35; 333/204; 333/219.2; 333/246; 333/185; 336/83; 336/200; 336/177; 324/249; 324/260
(58) Field of Search .......................... 333/35, 185, 204, 333/202, 219.2, 238, 246; 336/83, 200, 177, 182, 196, 198, 206, 232; 324/249, 260

(56) References Cited

U.S. PATENT DOCUMENTS

| | | | |
|---|---|---|---|
| 4,904,967 A | 2/1990 | Morii et al. .................. 333/185 |
| 4,959,631 A | 9/1990 | Hasegawa et al. ............. 336/83 |
| 5,365,391 A | * 11/1994 | Sugiyama et al. ........... 360/110 |
| 5,522,946 A | * 6/1996 | Tomita et al. ............... 148/304 |
| 5,583,470 A | * 12/1996 | Okubo ......................... 333/185 |
| 5,583,474 A | 12/1996 | Mizoguchi et al. ........... 336/83 |
| 5,694,030 A | * 12/1997 | Sato et al. ................... 323/282 |

* cited by examiner

*Primary Examiner*—Robert Pascal
*Assistant Examiner*—Barbara Summons
(74) *Attorney, Agent, or Firm*—Oblon, Spivak, McClelland, Maier & Neustadt, P.C.

(57) ABSTRACT

The present invention is directed to a magnetic thin-film device whose operating frequency band ranges from several millihertz (MHz) to several gigahertz (GHz) and which is used as an inductor for a switching power supply, a noise filter, a reception circuit for receiving a quasi-microwave and a magnetic sensor. In this device, uniaxial magnetic anisotropy is guided to a magnetic layer, and the magnetic layer is sandwiched between dielectric layers to form a propagation path of electromagnetic wave. A microstrip line is provided on the top surface of the propagation path, while an insulative underlying substrate is formed on the bottom surface thereof with a lower grounded conductor interposed therebetween. Thus, the wavelength of the propagation path can be shortened to miniaturize the device. The device is rapidly improved in characteristics and miniaturized further, resulting in reduction in manufacturing costs.

56 Claims, 11 Drawing Sheets

DISTRIBUTED CONSTANT ELEMENT USING A MAGNETIC THIN FILM

This application is a division of application Ser. No. 09/115,236 filed Jul. 14, 1998, now U.S. Pat. No. 6,121,852.

BACKGROUND OF THE INVENTION

The present invention relates to a distributed constant element using a magnetic thin film and, more particularly, to a magnetic thin-film device used as an inductor for switching power supplies, a noise filters a reception circuit for receiving a quasi-microwave such as a portable telephone and a PHS (Personal Handy-phone System), and a magnetic sensor.

The market for portable electronic apparatuses represented by a notebook personal computer, a portable telephone, a PHS, an electronic notebook has recently been expanded worldwide. These electronic apparatuses are decreased in size and increased in performance due to the progress of technology for semiconductor integrated circuits. As is well-known, a semiconductor integrated circuit includes integrated devices such as transistors, capacitors and resistors. Such an integrated circuit is improving in packing, density year by year and rapid advances are being made in one-chip techniques. However, a magnetic element such as an inductance and a transformer is difficult to miniaturize and make thin, though it is important for fulfilling a function such as energy storage, impedance matching and filtering. The magnetic element is therefore a great hindrance to improvement in the degree of integration of integrated circuits.

In contrast, as one method for making a magnetic element smaller and thinner, there is proposed a magnetic thin-film device which can be manufactured by a process similar to that of forming a semiconductor integrated circuit. The development of magnetic thin-film devices is described in detail in Kimisuke SHIRAE et al., Micro-magnetic Devices, 1st ed., Institute of Industrial Research of Japan, 1992 and in Recent Advance in Micro-Magnetic Engineering, National Convention of Institute of Electric Engineering of Japan, 1997. In the development of a magnetic thin-film device, it was first investigated to apply the device to a switching power supply having an operating frequency of one MHz to several tens of MHz. Recently, an inductance element (quasi-microwave band inductor) for mobile communication, whose operating frequency ranges from 1 GHz to 2 GHz, has been developed actively. The application of magnetic thin-film devices to a switching power supply and the development of a quasi-microwave band inductor were announced in a magnetic meeting of the Institute of Electric Engineering of Japan which was held in February of 1997.

FIGS. 1A and 1B schematically show a magnetic thin-film inductor developed for a 5 MHz switching DC-DC converter. As illustrated in FIG. 1A, the inductor has a sandwiched structure in which a coil (rectangular double spiral coil) 101 having a spiral pattern is sandwiched between interlayer insulation films 102 and the films 102 are sandwiched between soft magnetic thin films.103. As shown in FIG. 1B, the value Q (quality coefficient or performance coefficient or performance index) of the inductor is not so large but about 10 at most, due to eddy-current losses of the coil 101, which is caused by high-frequency magnetic fluxes leaking from the soft magnetic thin films 103, is considered to be great. If the inductor is applied to a power supply, it is desirable that the value Q should be as large as possible. Under the present conditions, however, there are no reliable methods for increasing in value Q.

FIGS. 2A and 2B schematically show a trial product of a magnetic thin-film transformer. Referring to these figures, primary and secondary coils 201 and 202 are alternately wound on a magnetic thin film 204 with an insulation film 203 interposed therebetween. Both ends of the secondary coil 202 are connected to each other through Schottky barrier diodes 206a and 206b formed on a silicon substrate 205. Since the transformer requires two or more coils, its structure is complicated and few trial products have been made. Though a combination of magnetic fluxes of the coils is important, it has been hardly examined systematically. The transformer is not only useful for energy conversion but also widely applied to an electronic circuit since it has an impedance matching function; however, a practical transformer using a magnetic thin film is under development.

FIGS. 3A and 3B schematically show a prior art magnetic thin-film inductor which is being developed to serve as an input/output matching circuit of a power amplifier for mobile communication and a power supply choke. In the prior art inductor, an air-core spiral coil has been used as a lumped constant element in an MMIC (Monolithic Microwave Integrated Circuit); however, its area is large and thus its manufacturing cost is high. Recently, there have been many attempts to reduce the area of the element using a magnetic thin film in an inductor for a several-GHz band. As illustrated in FIG. 3A, the magnetic thin-film inductor is so constituted that a Ti/Au film 301 is sandwiched between magnetic thin films 302 of cobalt type granular films and the sandwiched structure is provided on an SiON film 303 formed on a silicon substrate 304. However, neither the analysis nor the design of the element has been established. It is thus difficult to examine a relationship between the characteristics and structure of the element in consideration of parasitic element components, an increase in high-frequency loss and the like. Under the present conditions, the above magnetic thin-film inductor is being developed by trial and error and has a long way to go before it is put to practical use (see FIG. 3B).

There is a case where a ¼ wavelength transmission line transformer is used in an input/output matching circuit of a power amplifier for mobile communication. In this case, however, a dielectric substrate (whose dielectric constant is a value up to 8 and wavelength shortening rate is a value up to 3) such as alumina is often used in a propagation path of electromagnetic wave. For this reason, the line length of a ¼ wavelength transmission line transformer of about 1 GHz is about 25 mm. If this transformer is mounted on an MMIC, it is difficult to make the MMIC monolithic since the area of the transformer is large.

A highly sensitized magnetic sensor utilizing a change in magnetic permeability due to an external magnetic field has recently been proposed (e.g., in M. Senda and Y. Koshimoto, 1997 INTERMAG Conference, GP-18). FIGS. 4A to 4C illustrate the above highly sensitized magnetic sensor. This magnetic sensor is so constituted that a magnetic core 404 including soft magnetic thin films (NiFe) 402 and dielectric films ($SiO_2$) 403 which are alternately formed one on another, is provided so as to intersect with part of a conductor line 401 to sense a variation in impedance, which is proportional to a change in magnetic permeability of the soft magnetic thin films 402 due to an external magnetic field, as that of voltages at both ends of the conductor line 401. The impedance of a sensing section of the magnetic sensor is low. If, therefore, a ¼ wavelength line 405 terminating at high resistance is coupled to the magnetic sensor, impedance matching can be achieved. Moreover, the variation in voltages due to that in external magnetic field can be made great by the boost effect of the line 405; however, in the magnetic sensor, the sensing section can be decreased in size but a peripheral circuit including the line 405 is complicated. Consequently, the peripheral circuit is larger than the sensing section and the entire sensor system is difficult to miniaturize.

As described above, a magnetic thin-film device, which is under development in order to make magnetic elements small and thin, has a lot of problems of characteristics, size and costs when it is used in a variety of fields.

BRIEF SUMMARY OF THE INVENTION

As described above, the development and practicability of a magnetic thin-film device are delayed. It is desired that the device be improved rapidly in characteristics (performance), miniaturized (thinned) further, and decreased in manufacturing cost.

It is accordingly an object of the present invention to provide a distributed constant element improved characteristics (performance), decreased in size (thickness) and of reduced manufacturing cost in accordance with the development and practicability of various types of magnetic thin-film devices.

To attain the above object, according to a first aspect of the present invention, there is provided a distributed constant element comprising a soft magnetic metal layer, and conductor layers provided so as to sandwich the soft magnetic metal layer, a dielectric layer being interposed between the soft magnetic metal layer and each of the conductor layers.

According to a second aspect of the present invention, there is provided a distributed constant element comprising a soft magnetic metal layer having uniaxial magnetic anisotropy, conductor layers provided so as to sandwich the soft magnetic metal layer, and a dielectric layer being interposed between the soft magnetic metal layer and each of the conductor layers.

According to a third aspect of the present invention, there is provided a distributed constant element comprising a conductor layer, soft magnetic metal layers provided so as to sandwich the conductor layer, and a dielectric layer being interposed between the conductor layer and each of the soft magnetic metal layers.

According to a fourth aspect of the present invention, there is provided a distributed constant element comprising a conductor layer, soft magnetic metal layers provided so as to sandwich the conductor layer, and a dielectric layer being interposed between the conductor layer and each of the soft magnetic metal layers.

According to a fifth aspect of the present invention, there is provided a microstrip line type distributed constant element comprising a lower conductor layer provided on an insulative substrate, a soft magnetic metal layer formed on the lower conductor layer with a dielectric layer interposed therebetween, and having uniaxial magnetic anisotropy, and an upper conductor layer formed on the soft magnetic metal layer with a dielectric layer interposed therebetween.

According to a sixth aspect of the present invention, there is provided a parallel line type distributed constant element comprising a lower conductor layer provided on an insulative substrate, a soft magnetic metal layer formed on the lower conductor layer with a dielectric layer interposed therebetween, and having uniaxial magnetic anisotropy, and an upper conductor layer formed on the soft magnetic metal layer with a dielectric layer interposed therebetween and having substantially the same shape as that of the lower conductor layer.

According to a seventh aspect of the present invention, there is provided an inner conductor line type distributed constant element comprising a lower soft magnetic metal layer provided on an insulative substrate, a conductor layer formed on the lower soft magnetic metal layer with a dielectric layer interposed therebetween, and an upper soft magnetic metal layer formed on the conductor layer with a dielectric layer interposed therebetween.

In the distributed constant element having the above constitution, various types of reception circuits, which are constituted by a combination of lumped constant elements such as an inductance element, a capacitance element and a resistance element, can be miniaturized and, in other words, a transmission line can be formed by distributed constants (distributed inductance, distributed capacitance, distributed loss resistance). It is thus possible to shorten the wavelength (line length) of a propagation path of an electromagnetic wave.

More specifically, when a low-loss line is formed as a magnetic thin-film device whose operating frequency ranges from several millihertz to several gigahertz, an impedance matching circuit (transformer) can be achieved if the line length is set equal to ¼ of the wavelength.

If the terminal of the low-loss line is short-circuited, an inductance element having a high Q value can be achieved in a frequency band where the line length is considerably shorter than ¼ of the wavelength.

If a line is increased in loss at high frequency, a low-pass filter can be attained by both the distributed capacitance and distributed inductance.

Utilizing a variation in magnetic permeability of a soft magnetic metal layer with an external magnetic field, the terminal voltage of a ¼ wavelength low-loss line terminating at high resistance, is greatly changed due to the external magnetic field, resulting in a highly sensitized magnetic sensor.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments give below, serve to explain the principles of the invention.

FIG. 15A is a characteristic diagram of a parallel line type low-pass filter using a 20 Ω pure resistance for a load, while

DETAILED DESCRIPTION OF THE INVENTION

Embodiments of the present invention will now be described with reference to the accompanying drawings.

(First Embodiment)

Figure 1A:
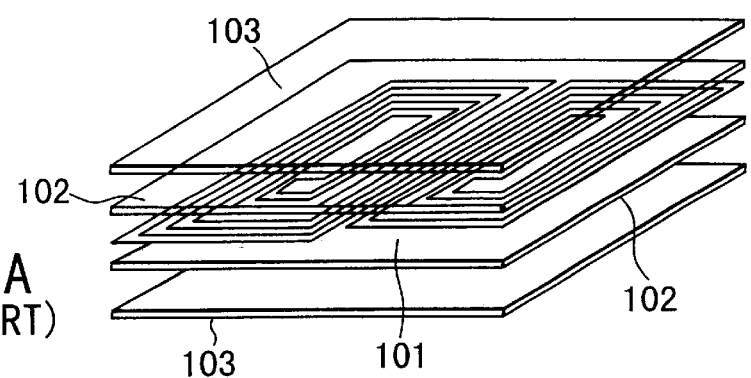
FIG. 1A is an exploded, perspective view illustrating the structure of a prior art magnetic thin-film inductor developed for a DC-DC converter.
Figure 1B:
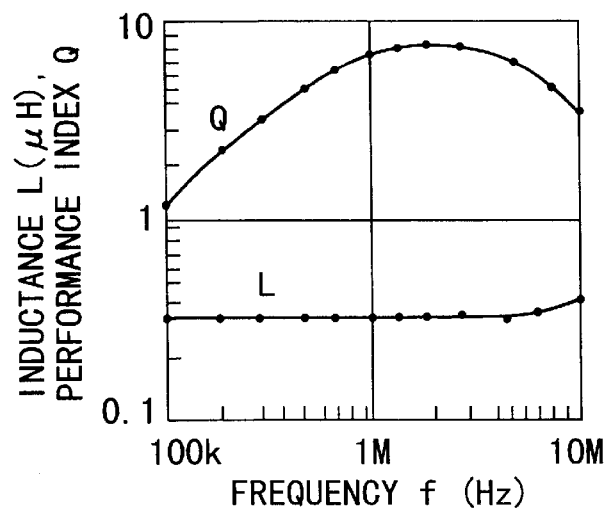
FIG. 1B is a characteristic diagram of the inductor of FIG. 1A.
Figure 2A:
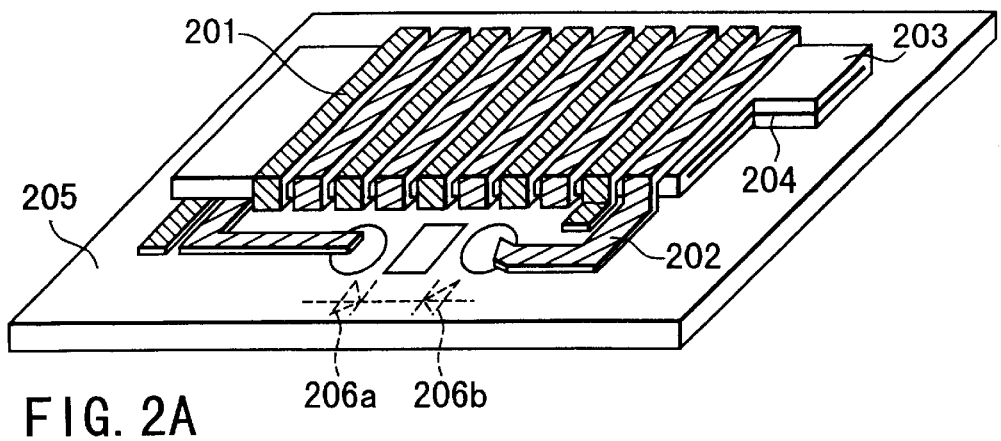
FIG. 2A is a perspective view showing the structure of a prior art magnetic thin-film transformer.
Figure 2B:
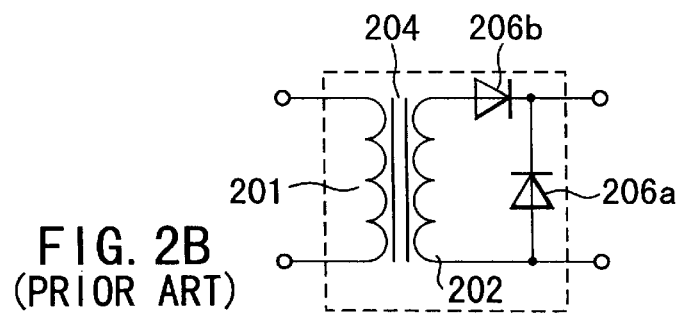
FIG. 2B is an equivalent circuit diagram of the transformer of FIG. 2A.
Figure 3A:
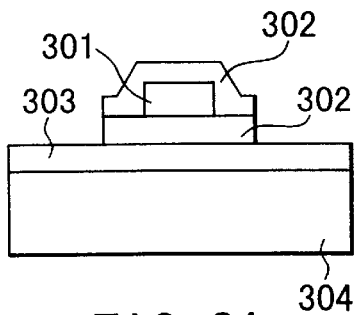
FIG. 3A is a view of a prior art magnetic thin-film inductor which is under development to serve as both an input/output matching circuit of a power amplifier for mobile communication and a power supply choke.
Figure 3B:
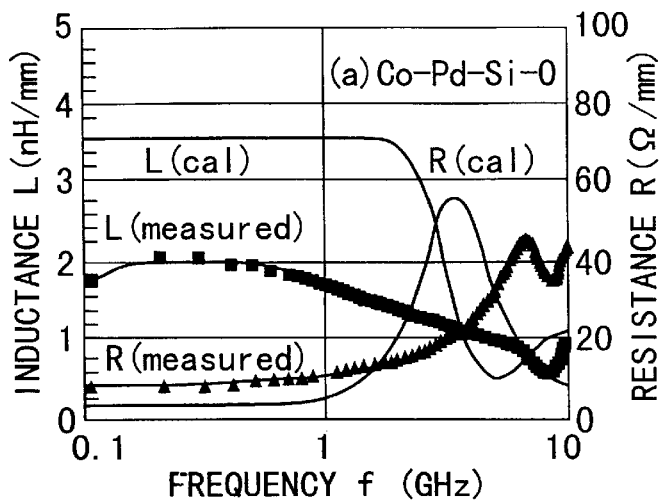
FIG. 3B is a characteristic diagram of the inductor of FIG. 3A.
Figure 4A:
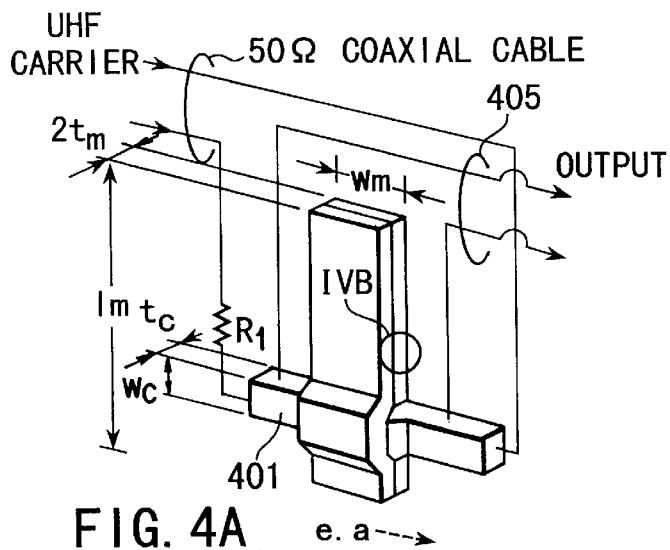
FIG. 4A is a perspective view of the structure of a prior art highly sensitized magnetic sensor.
Figure 4B:
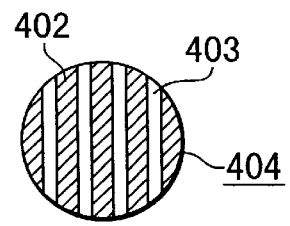
FIG. 4B is an enlarged view of part of the magnetic sensor.
Figure 4C:
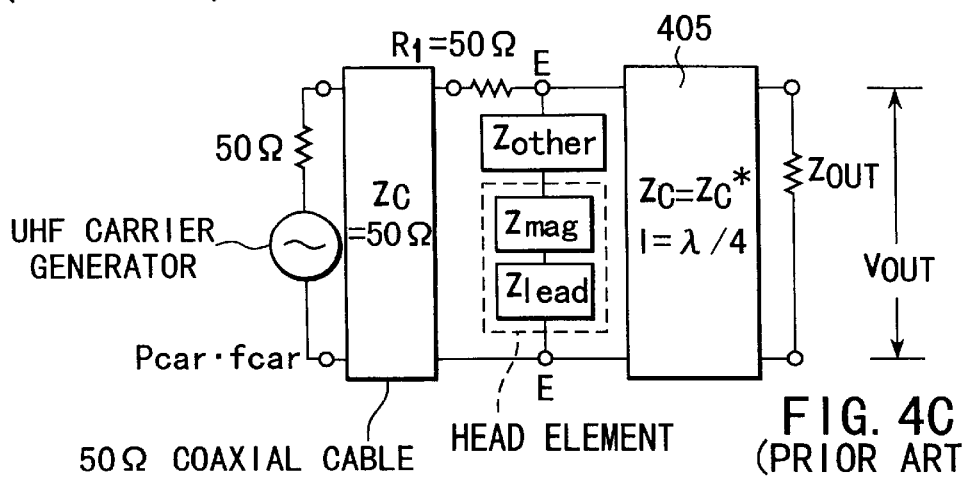
FIG. 4C is an equivalent circuit of the sensor of FIG. 4A.
Figure 5:
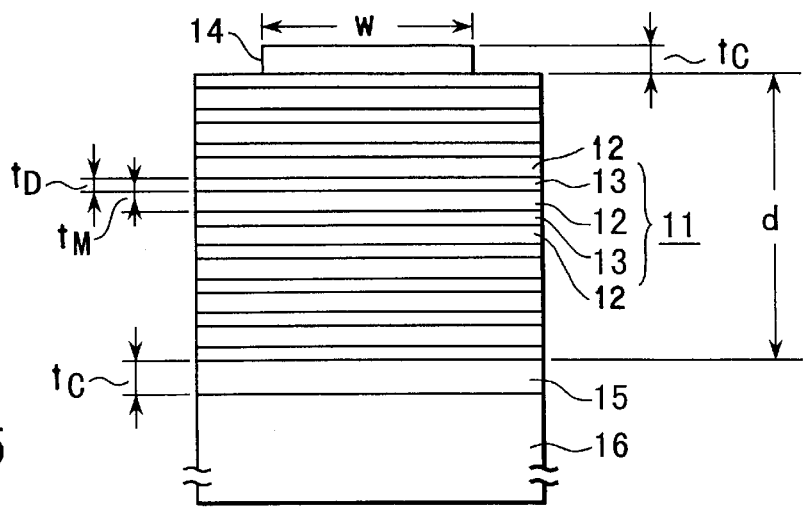
FIG. 5 is a view of the fundamental structure of a microstrip line type distributed constant element according to a first embodiment of the present invention.

FIG. 5 schematically shows the fundamental structure of a microstrip line type distributed constant element according to a first embodiment of the present invention. The distributed constant element includes a propagation path 11 of an electromagnetic wave. The path 11 has a stacked structure in which a magnetic layer (soft magnetic metal layer) 12 is sandwiched between dielectric layers 13. A microstrip line (upper conductor line) 14 is provided on the top surface of the propagation path 11, and a lower grounded conductor (lower conductor line) 15 is formed on the bottom surface thereof. The distributed constant element is thus formed on an insulative underlying substrate (insulative substrate) 16 with the lower grounded conductor 15 interposed therebetween.

The magnetic layer 12, dielectric layer 13 and lower grounded conductor 15 have thicknesses of $t_M$, $t_D$ and $t_C$, respectively. These layers 12, 13 and 15 have substantially the same width.

Magnetic layer 12 has uniaxial magnetic anisotropy in a predetermined direction.

The microstrip 14 has substantially the same thickness $t_C$ as that of the lower grounded conductor 15.

The width w of the microstrip line 14 is smaller than that of the lower grounded conductor 15.

Since the magnetic layer 12 and dielectric layers 13 contribute to an operation of the microstrip line type distributed constant element, the wavelength of the propagation path 11 is shortened (wavelength shortening effect) as compared with the conventional propagation path constituted only by a dielectric layer of alumina or the like. Consequently, when an impedance matching circuit (transformer) is formed using a ¼ wavelength line, the length of the line is shortened; accordingly, the circuit can greatly be decreased in size (miniaturized).

In a propagation path of an electromagnetic wave constituted only by a dielectric layer as in the conventional microstrip line type element, if magnetic fringing at end portions of a microstrip line is ignored, inductance L per unit length of the line is given as follows (w=conductor width>>d=distance between conductor lines):

$$L = \mu_D \frac{d}{w} - \mu_O \frac{d}{w} \tag{1}$$

where $\mu_D$ is magnetic permeability of the dielectric layer, which is almost equal to that ($\mu_0$) of vacuum or air. Capacitance C per unit length of the line can be expressed $$C = \varepsilon \frac{w}{d} \quad (2)$$

where $\varepsilon$ is dielectric constant of the dielectric layer. If a loss of the line is ignored for simplification, wavelength $\lambda$ is given by the following equation ($\varepsilon_S$ is the dielectric constant of the dielectric layer):

$$\lambda = \frac{3 \times 10^8}{f \sqrt{\varepsilon_s}} \quad (3)$$

In the microstrip line type element of the present invention (FIG. 5), the magnetic flux caused by current flowing through the microstrip line 14 is shielded by the internal magnetic layer 12, so that no shield effect is created in the grounded conductor 15. In this case, inductance L per unit length of the line is given by the following equation:

$$L = 2A \left( \log_e \left( \frac{2l}{w + t_c} \right) + 0.2505 + \frac{w + t_c}{3l} \right) \times 10^{-7} \quad (4)$$

where l is line length of the element. The value of A varies with the total thickness ($Nt_M$) of the magnetic layer 12 and magnetic permeability $\mu$ as follows. The greater the total thickness and the magnetic permeability, the nearer to 2 the value of A comes:

$$1 < A < 2 \quad (5)$$

Assuming that the number of magnetic layers 12 is N and the thickness of each of the dielectric layers 13 is $t_D$, capacitance C per unit length of the line is expressed as follows:

$$C = \varepsilon \frac{w}{(N+1)t_D} \quad (6)$$

The wavelength $\lambda$ is therefore given by the following equation:

$$\lambda = \frac{1}{f \sqrt{2A \left( \log_e \left( \frac{2l}{w + t_c} \right) + 0.2505 + \frac{w + t_c}{3l} \right) \varepsilon \frac{w}{(N+1)t_D} \times 10^{-7}}} \quad (7)$$

If w, d, $t_C$ (conductor thickness), l, $\varepsilon_S$, N, $t_D$ of the above equations are set to the following values, w=100 $\mu$m
d=10 $\mu$m
$t_C$=10 $\mu$m
l=5 mm
$\varepsilon_S$=10
N=5
$t_D$=1 $\mu$m the wavelength of the microstrip line type element of the present invention is 0.28 times as long as that of the prior art element using only a dielectric layer. Thus, in the present invention, the line length can be shortened and accordingly the element size can be reduced.

Figure 6A:
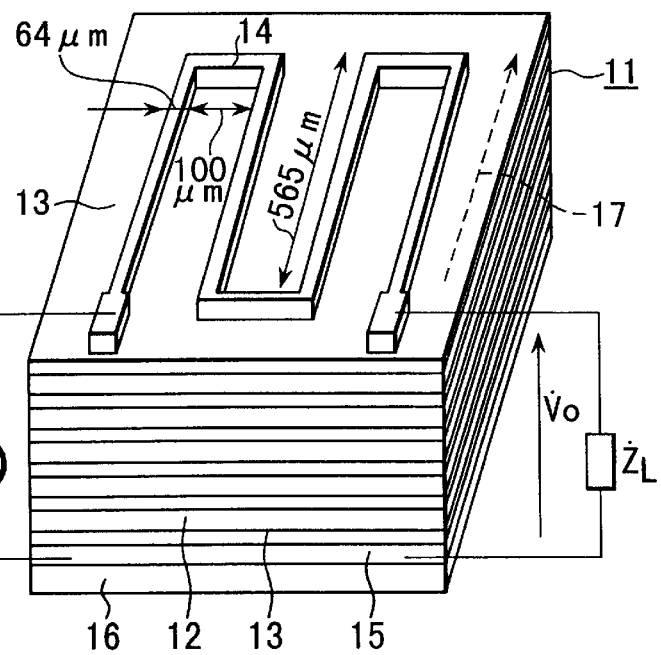
FIG. 6A is a perspective view of a ¼ wavelength transformer which is constituted by the microstrip line type distributed constant element.
Figure 6B:
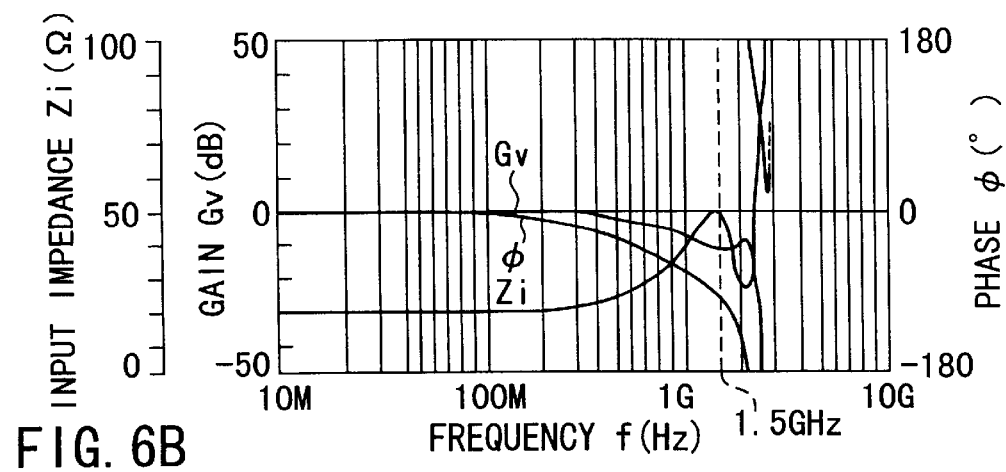
FIG. 6B is a characteristic diagram of the transformer of FIG. 6A.

FIGS. 6A and 6B illustrate the structure of a ¼ wavelength transformer constituted by the above microstrip line type distributed constant element. FIG. 6A is a perspective view of the transformer, and FIG. 6B is a characteristic diagram thereof. In the ¼ wavelength transformer, an FeSmZr amorphous alloy of zero magnetostrictive composition is used for the magnetic layers 12, $SiO_2$ is used for the dielectric layers 13, Au is employed for both the microstrip line 14 and lower grounded conductor 15, and the insulative underlying substrate 16 is GaAs. The ¼ wavelength tuning frequency is set to 1.5 GHz.

The thickness $t_M$ of each of the magnetic layers 12 is 0.2 $\mu$m, the real part $\mu_S'$ of high frequency complex (ratio) magnetic permeability is 100, and the number N of magnetic layers 12 is 5.

The thickness $t_D$ of each of the dielectric layers 13 is 0.2 $\mu$m, and the dielectric constant $\varepsilon_S$ is 4.

As shown in FIG. 6A, the microstrip line 14 has an almost W-shaped meander pattern (the number of, turns is two), and the thickness $t_C$ thereof is 4 $\mu$m and the ratio of line with to line spacing is 64 $\mu$m to 100 $\mu$m.

When the ¼ wavelength tuning frequency is 1.5 GHz, the line length is 2260 $\mu$m, and the length of the microstrip line 14 required for achieving the line length is 565 $\mu$m.

Magnetic layers 12 have uniaxial magnetic anisotropy, and their easy magnetization axis 17 is parallel to the longitudinal direction of the microstrip line 14. A good rotation magnetization process of high frequency characteristics can thus be utilized.

Since a magnetic field is generated along the easy magnetization axis 17 at the turns of the meander pattern, the contribution of the magnetic layers 12 can hardly be expected at high frequency. The characteristic impedance and propagation constant at the turns of the meander pattern differ from those in a rotating magnetization region, but they do not have great influence on various characteristics because of the small line length.

For example, if the ¼ wavelength transformer terminates at impedance $Z_L$ of 20 $\Omega$, as shown in FIG. 6B, input impedance Zi is about 50 $\Omega$ when the ¼ wavelength tuning frequency is 1.5 GHz and thus impedance is matched with a 50 $\Omega$ system.

When a microstrip line type ¼ wavelength transformer having the above constitution is applied to an input matching circuit of a 1.5 GHz mobile communication power amplifier (GaAs-MES-FET), normal operation can be confirmed.

In the ¼ wavelength transformer, the matching circuit, which was conventionally constituted of a capacitor and an inductor of lumped constant elements, is greatly simplified, and the mounting area of the matching circuit is ⅓ times as large as that of the prior art circuit.

In order to constitute the ¼ wavelength transformer, the natural resonance frequency, which determines the upper limit of the frequency used in the magnetic layers 12, is 2.8 GHz and has to be higher than the ¼ wavelength tuning frequency (1.5 GHz).

Figure 7A:
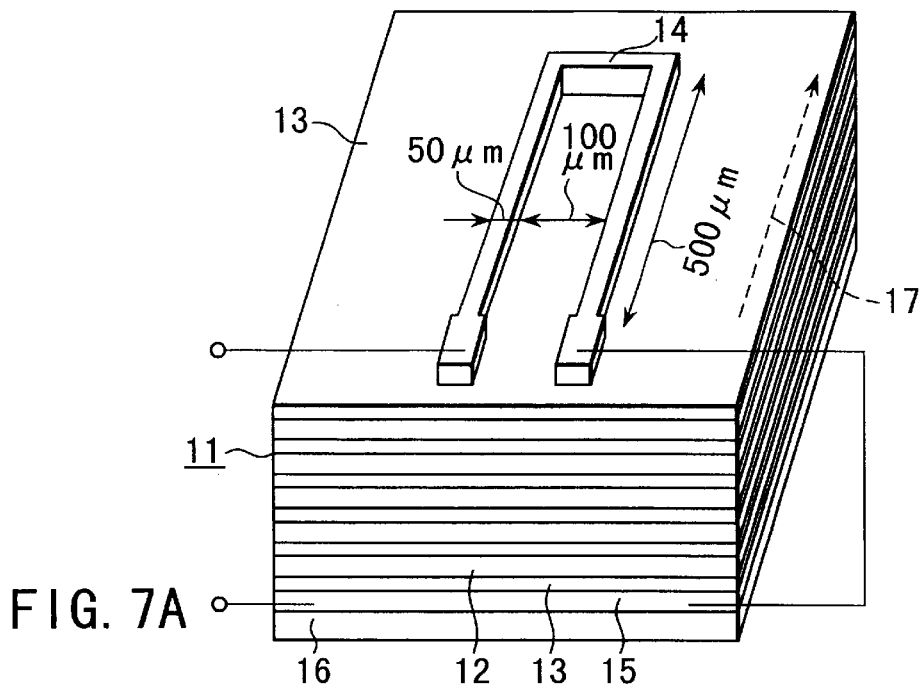
FIG. 7A is a perspective view of a terminal short-circuit inductor which is constituted by the microstrip line type distributed constant element.
Figure 7B:
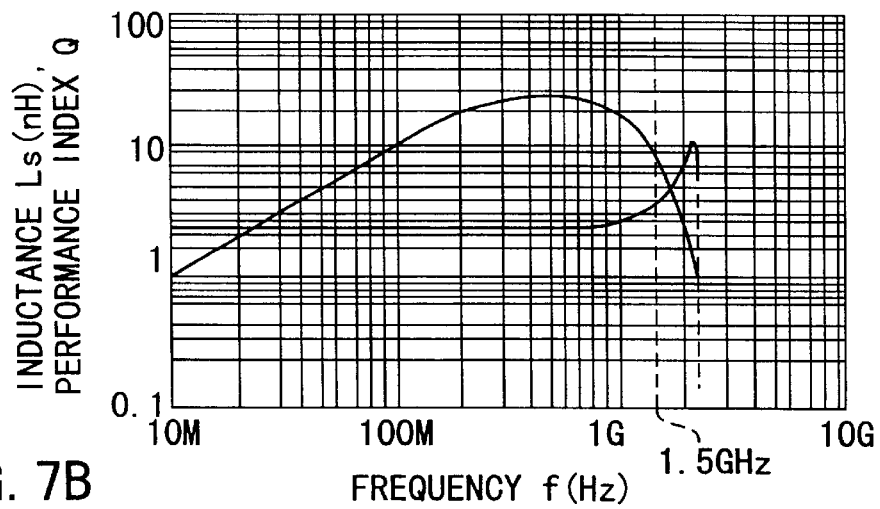
FIG. 7B is a characteristic diagram of the inductor of FIG. 7A.

FIGS. 7A and 7B illustrate the structure of a terminal short-circuit inductor constituted by the above microstrip line type distributed constant element. FIG. 7A is a perspective view of the inductor, and FIG. 7B is a characteristic diagram thereof. In the inductor, as is similar to the foregoing ¼ wavelength transformer, an FeSmZr amorphous alloy of zero magnetostrictive composition is used for the magnetic layers 12, $SiO_2$ is used for the dielectric layers 13, Au is employed for both the microstrip line 14 and lower grounded conductor 15, and the insulative underlying substrate 16 is GaAs.

In the magnetic layers 12, $t_M$ is 0.2 $\mu$m, $\mu_S'$ is 100, and N is 5 and, in the dielectric layers 13, $t_D$ is 0.2 $\mu$m and $\varepsilon_S$ is 4.

As shown in FIG. 7A, the microstrip line 14 has an almost U-shaped meander pattern (the number of turns is one), and the thickness $t_C$ thereof is 4 μm and the ratio of line width to line spacing is 50 μm to 100 gm.

The length of the microstrip line 14 is set to about 500 μm.

Magnetic layers 12 have uniaxial magnetic anisotropy, and their easy magnetization axis 17 is parallel to the longitudinal direction of the microstrip line 14.

The equivalent series inductance $L_S$ and performance index Q of the terminal short-circuit inductor were measured. As shown in FIG. 7B, when the ¼ wavelength tuning frequency is 1.5 GHz, $L_S$ is about 4 nH and Q is about 10.

When a microstrip line type terminal short-circuit inductor having the above constitution is used as a power supply choke of a GaAs-MES-TFT for 1.5 GHz mobile communication, normal operation can be confirmed.

In the terminal short-circuit inductor, its construction can greatly be simplified while maintaining a performance index (Q) almost equal to that of the conventional inductor, which is advantageous to make an MMIC monolithic. Since the terminal short-circuit inductor differs from the above ¼ wavelength transformer only in the width and pattern of microstrip line 14, they can be manufactured at the same time by forming them on the same substrate 16.

Figure 8:
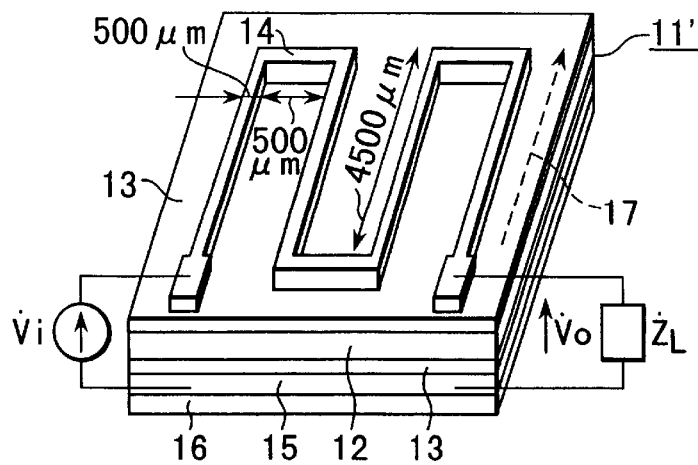
FIG. 8 is a perspective view of a low-pass filter which is constituted by the microstrip line type distributed constant element.

FIG. 8 illustrates a low-pass filter constructed using magnetic metal, which increases in loss at high frequency, for a magnetic layer in the microstrip line type distributed constant element. In this low-pass filter, an FeCoBC amorphous film is used as the magnetic layer 12 and an AlN film is used as a dielectric film 13 to constitute a propagation path 11' of an electromagnetic wave. Furthermore, Cu (20 μm) and Cr (0.1 μm) are used for microstrip line 14 and lower grounded conductor 15, respectively, and an Si substrate is used as an insulative underlying substrate 16.

In the magnetic layer 12, $t_M$ is 6 μm, $\mu_S'$ is 1100, and N is 5 and, in the dielectric layer 13, $t_D$ is 0.1 μm and $\epsilon_S$ is 8.

The microstrip line 14 has an almost W-shaped meander pattern (the number of turns is two), and the thickness $t_C$ thereof is 20 μm and the ratio of line width to line spacing is 500 μm to 500 μm.

The length of the microstrip line 14 is set to about 4500 μm.

Magnetic layer 12 has uniaxial magnetic anisotropy, and its easy magnetization axis 17 is parallel to the longitudinal direction of the microstrip line 14.

Figure 9:
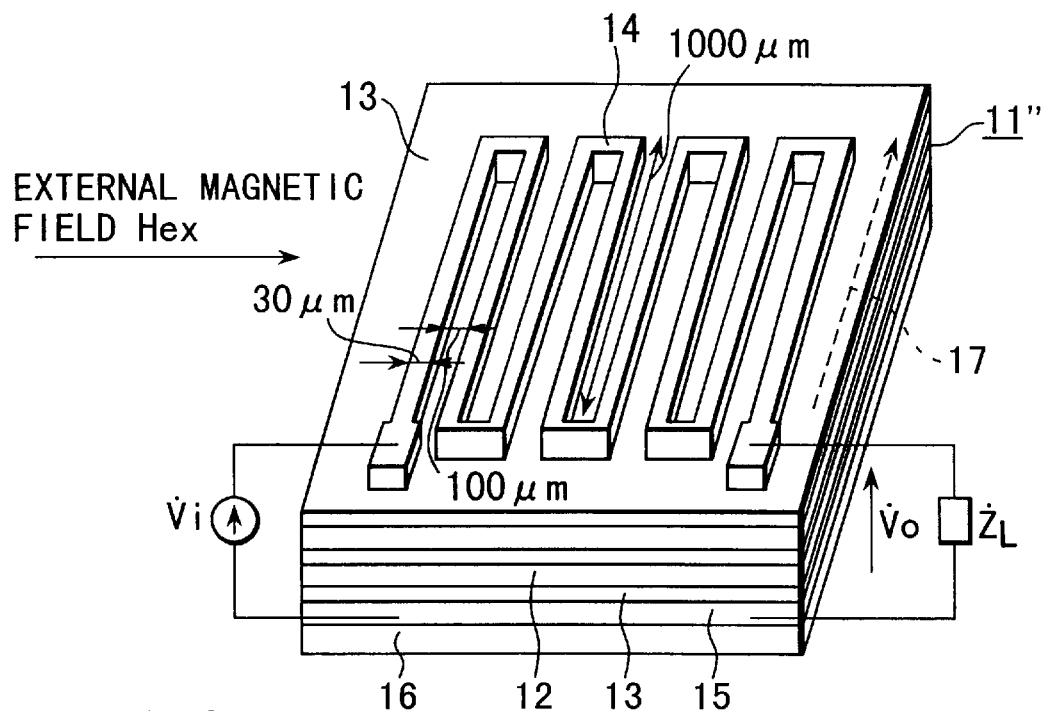
FIG. 9 is a perspective view of a magnetic sensor which is constituted by the microstrip line type distributed constant element.

FIG. 9 illustrates a magnetic sensor to which the microstrip line type distributed constant element is applied. In this magnetic sensor, a CoZrNb amorphous magnetic film is used as a magnetic layer 12 and an $SiO_2$ film is used as a dielectric film 13 to constitute a propagation path 11" of an electromagnetic wave. Furthermore, Cu (5 μm) and Cr (0.1 μm) are used in a microstrip line 14 and a lower grounded conductor 15, respectively, and an Si substrate is used as an insulative underlying substrate 16. When an external magnetic field Hex is 0, the ¼ wavelength tuning frequency is set to 39 MHz.

In the magnetic layer 12, $t_M$ is 0.5 μm, $\mu_S'$ is 2000, and N is 2 and, in the dielectric layer 13, $t_D$ is 0.05 μm and $\epsilon_S$ is 4.

The microstrip line 14 has a meander pattern, the number of turns being four, and the thickness $t_C$ thereof is 5 μm and the ratio of line width to line spacing is 30 μm to 100 μm. The length of the microstrip line 14 is set to about 1000 μm.

Magnetic layer 12 has uniaxial magnetic anisotropy, and its easy magnetization axis 17 is parallel to the longitudinal direction of the microstrip line 14.

The construction of the above magnetic sensor can be simplified, as can be that of its peripheral circuit. Thus, the whole sensor system can easily be miniaturized.

(Second Embodiment)

Figure 10:
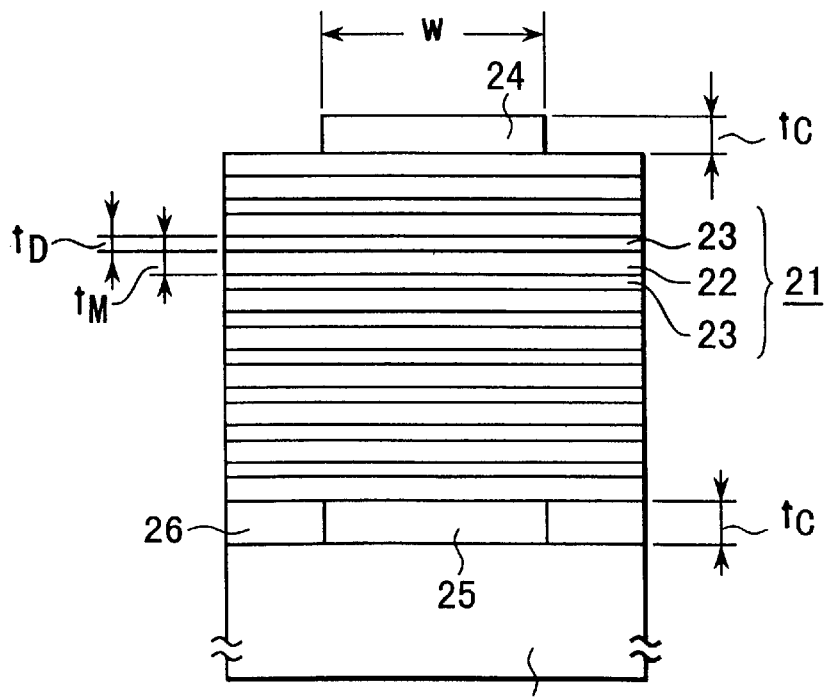
FIG. 10 is a view of the fundamental structure of a parallel line type distributed constant element according to a second embodiment of the present invention.

FIG. 10 schematically shows the fundamental structure of a parallel line type distributed constant element according to a second embodiment of the present invention. The distributed constant element includes a propagation path 21 of an electromagnetic wave. The path 21 has a stacked structure in which a magnetic layer (soft magnetic metal layer) 22 is sandwiched between dielectric layers 23. An upper conductor line 24 is provided on the top surface of the propagation path 21, and a lower grounded conductor (lower conductor line) 25, which has substantially the same width (w) and has substantially the same shape as that of the line 24, is formed on the bottom surface of the propagation path 21. The distributed constant element is thus formed on an insulative underlying substrate 27 with the lower grounded conductor 25 interposed therebetween.

The magnetic layer 22 and dielectric layer 23 have thicknesses of $t_M$, $t_D$ and $t_C$, respectively, as in the case of the above microstrip line type distributed constant element. These layers 22 and 23 have substantially the same width. Magnetic layer 22 has uniaxial magnetic anisotropy.

The upper conductor line 24, lower grounded conductor 25 and dielectric layer 26 each have a thickness $t_C$.

In the parallel line type distributed constant element, characteristic impedance $Z_c$ (=$R_c$-$jX_c$) is expressed as follows, $$R_c = 377\sqrt{\frac{\mu_s'}{\epsilon_s}} \frac{d'}{w}\left(1 + \frac{1}{8}k^2\right) \tag{8}$$

$$X_c = 188\sqrt{\frac{\mu_s'}{\epsilon_s}} \frac{d'}{w}k \tag{9}$$

and propagation constant γ (=α+jβ) is given as follows:

$$\alpha = \frac{\omega K}{2} \frac{\sqrt{\mu_s'\epsilon_s}}{3\times 10^8} k \tag{10}$$

$$\beta = \omega K \frac{\sqrt{\mu_s'\epsilon_s}}{3\times 10^8}\left(1 + \frac{1}{8}k^2\right) \tag{11}$$

where coefficient K=($\mu''$+2$\rho_c$/$\omega$N$t_M t_c$)/$\mu'$,
coefficient K=$\sqrt{Nt_M/(N+1)t_D}$,
coefficient d'=$\sqrt{N(N+1)t_M t_D}$,
$\mu'(\mu_S')$: real part of high frequency complex (ratio) magnetic permeability of magnetic layer
$\mu''$: imaginary part of high frequency complex (ratio) magnetic permeability of magnetic layer
$t_M$: thickness of each magnetic layer
N: the total number of magnetic layers
$\epsilon_S$: dielectric constant of dielectric layer
$t_D$: thickness of each dielectric layer
$\rho_c$: conductor resistivity of parallel line
$t_C$: conductor thickness of parallel line
w: conductor width of parallel line
ω: 2πf (f=frequency)

Even when a ¼ wavelength transformer or a terminal short-circuit inductor is constituted by the above parallel line type distributed constant element, substantially the same effect as that in the case where it is constituted by the microstrip line type distributed constant element, can be expected.

Figure 11:
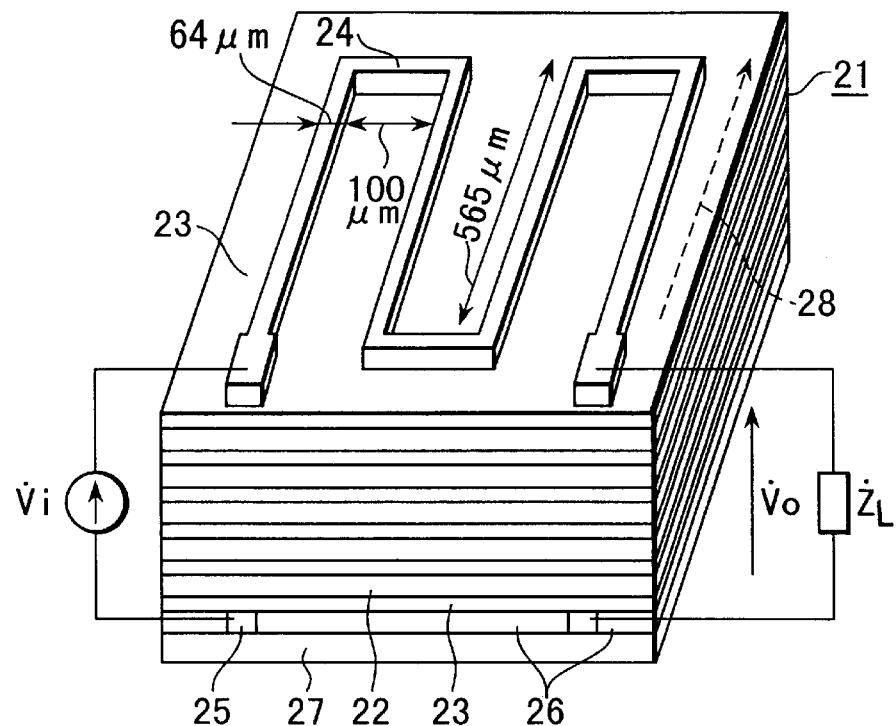
FIG. 11 is a perspective view of a ¼ wavelength transformer which is constituted by the parallel line type distributed constant element.

FIG. 11 illustrates a ¼ wavelength transformer constituted by the above parallel line type distributed constant element.

This transformer is constituted in the same fashion as the foregoing microstrip line type ¼ wavelength transformer (shown in FIG. 6A). More specifically, in the parallel line type ¼ wavelength transformer, an FeSmZr amorphous alloy of zero magnetostrictive composition is used for the magnetic layers 22, $SiO_2$ is used for the dielectric layers 23 and 26, Au is employed for both the upper conductor line 24 and lower grounded conductor 25, and GaAs is applied to the insulative underlying substrate 27. The ¼ wavelength tuning frequency is set to 1.5 GHz.

The thickness $t_M$ of each of the magnetic layers 22 is 0.2 μm, the real part $\mu_s'$ of high frequency complex (ratio) magnetic permeability is 100, and the number N of magnetic layers 12 is 5. The thickness $t_D$ of each of the dielectric layers 23 is 0.2 μm, and the dielectric constant $\epsilon_S$ is 4.

The upper conductor line 24 and lower grounded conductor 25 each have an almost W-shaped meander pattern (the number of turns is two), and the thickness $t_C$ thereof is 4 μm and the ratio of line width to line spacing is 64 μm to 100 μm. The end (terminal) portions of the lower grounded conductor 25 are drawn out of the front of the transformer so as to be connected to an external device. When the ¼ wavelength tuning frequency is 1.5 GHz, the line length is 2260 μm, and the length of the upper conductor line 24 is 565 μm. Magnetic layer 22 has the uniaxial magnetic anisotropy, and their easy magnetization axis 28 is parallel to the longitudinal direction of the upper conductor line 24.

Even in the above-described ¼ wavelength transformer constituted by the parallel line type distributed constant element, substantially the same characteristics as those of the microstrip line type distributed constant element, were confirmed.

Figure 12:
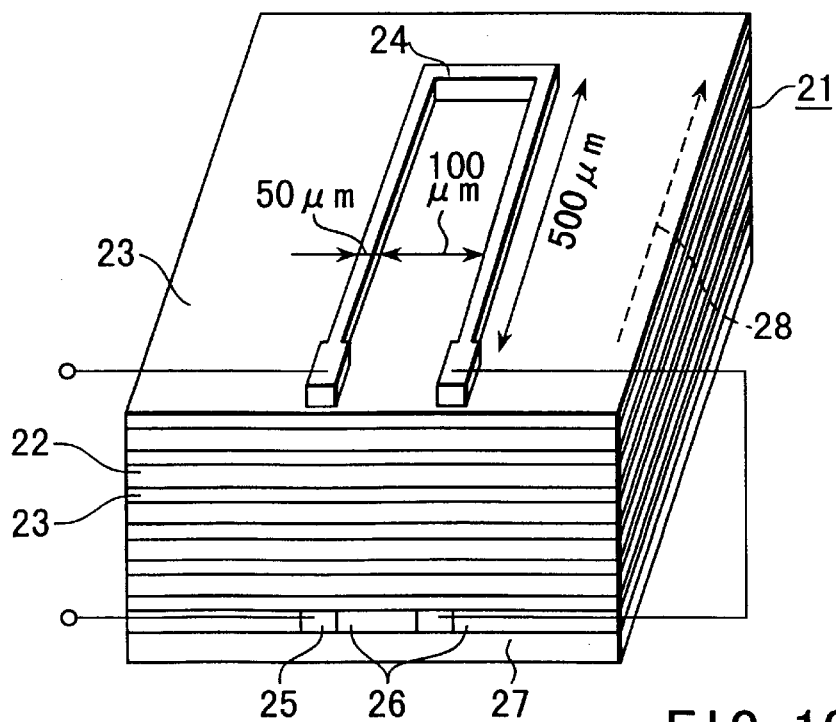
FIG. 12 is a perspective view of a terminal short-circuit inductor which is constituted by the parallel line type distributed constant element.

FIG. 12 illustrates a terminal short-circuit inductor constituted by the above-described parallel line type distributed constant element. This inductor is constructed in the same fashion as the foregoing microstrip line type terminal short-circuit inductor (shown in FIG. 7A). More specifically, in the parallel line type terminal short-circuit inductor, an FeSmZr amorphous alloy of zero magnetostrictive composition is used for the magnetic layers 22, $SiO_2$ is used for the dielectric layers 23 and 26, Au is employed for both the upper conductor line 24 and lower grounded conductor 25, and GaAs is applied to the insulative underlying substrate 27.

In the magnetic layers 12, $t_M$ is 0.2 μm, $\mu_s'$ is 100, and N is 5 and, in the dielectric layers 23, $t_D$ is 0.2 μm and $\epsilon_S$ is 4.

The upper conductor line 24 and lower grounded conductor 25 each have an almost U-shaped meander pattern (the number of turns is one), and the thickness $t_C$ thereof is 4 μm and the ratio of line to space is 50 μm to 100 μm. The length of the upper conductor line 24 is about 500 μm. The end (terminal) portions of the lower grounded conductor 25 are drawn out of the front of the inductor so as to be connected to an external device.

Magnetic layer 22 has uniaxial magnetic anisotropy, and their easy magnetization axis 28 is parallel to the longitudinal direction of the upper conductor line 24.

Even in the foregoing terminal short-circuit inductor constituted by the parallel line type distributed constant element, substantially the same characteristics as those of the microstrip line type distributed constant element, were confirmed.

The parallel line type distributed constant element having the above constitution is not limited to a ¼ wavelength transformer or a terminal short-circuit inductor. For example, as the microstrip line type distributed constant element, it can be applied to a low-pass filter and a magnetic sensor.

Since the parallel line type element of the present invention includes a magnetic layer, magnetic fluxes of adjacent conductor lines are firmly combined. If the conductor lines have a meander pattern, mutual inductance M of the conductor lines is negative and thus the inductance L per unit length is decreased. For this reason, the wavelength shortening effect is lost and the element cannot be miniaturized so greatly. Therefore, the structure of a conductor line, which makes mutual inductance M between adjacent conductor lines positive, will now be described.

Figure 13:
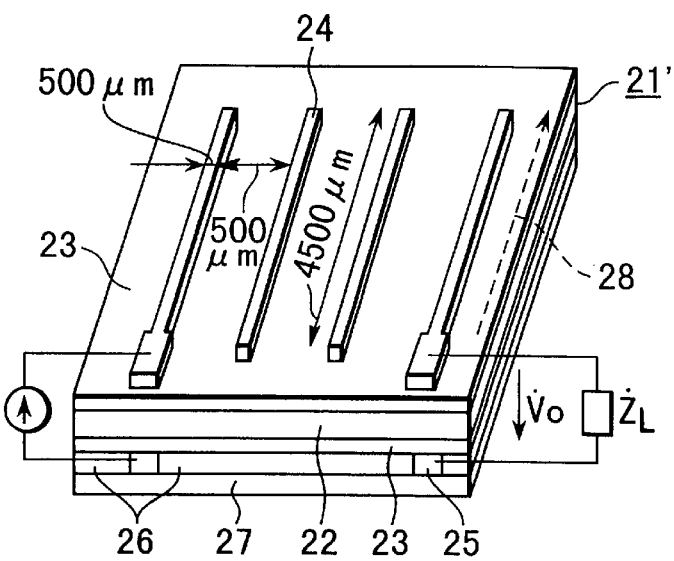
FIG. 13 is a perspective view of a low-pass filter which is constituted by the parallel line type distributed constant element.

FIG. 13 illustrates a low-pass filter constituted using magnetic metal, which increases in loss at high frequency, for a magnetic layer in the parallel line type distributed constant element. The structure of the low-pass filter is basically the same as that of the foregoing microstrip line type low pass filter (see FIG. 8). In the filter shown in FIG. 13, an FeCoBC amorphous film is used as a magnetic layer 22 and an AlN film is used as a dielectric film 23 to constitute a propagation path 21' of an electromagnetic wave. Further, Cu (20 μm) and Cr (0.1 μm) are used for an upper conductor line 24 and a lower grounded conductor 25, respectively, and Si is used for an insulative underlying substrate 27.

In the magnetic layer 22, $t_M$ is 6 μm, $\mu_s'$ is 1100, and N is 1 and, in the dielectric layer 23, $t_D$ is 0.1 μm and $\epsilon_S$ is 8. The upper conductor line 24 and lower grounded conductor 25 each have a plurality of (four) almost I-shaped linear patterns, and the thickness $t_C$ thereof is 20 μm and the ratio of line width to line spacing is 500 μm to 500 μm. The length of the upper conductor line 24 is set to about 4500 μm.

The linear patterns of the upper conductor line 24 and those of the lower grounded conductor 25 are connected to each other substantially in a spiral such that all currents flow through the patterns in the same direction, the details of which are described below.

The end (terminal) portions of the lower grounded conductor 25 are drawn out of the front of the inductor so as to be connected to an external device.

The uniaxial magnetic anisotropy is guided to the magnetic layer 22, and its easy magnetization axis 28 is parallel to the longitudinal direction of the upper conductor line 24.

Figure 14A:
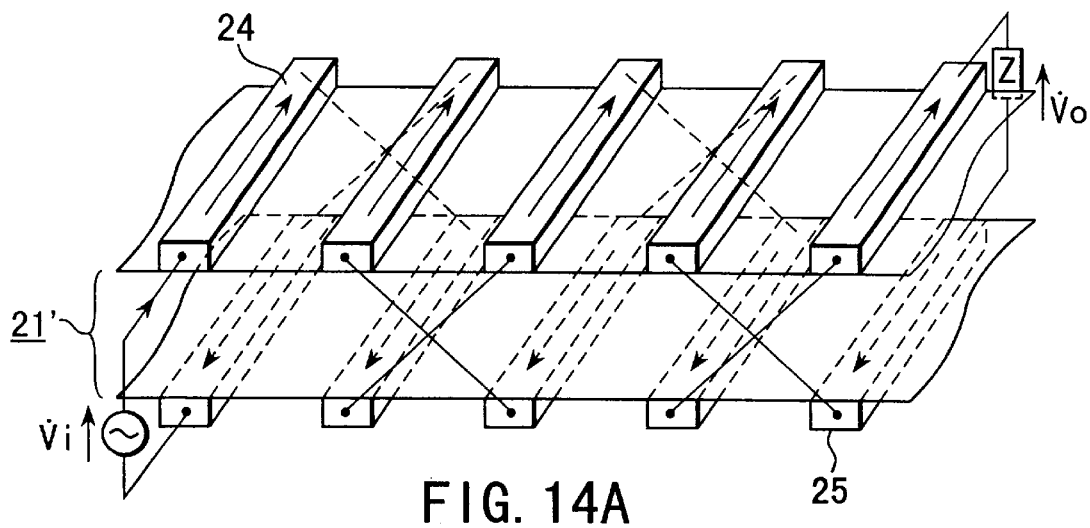
FIG. 14A is a perspective view showing the structure of a conductor line in a parallel line type low-pass filter.
Figure 14B:
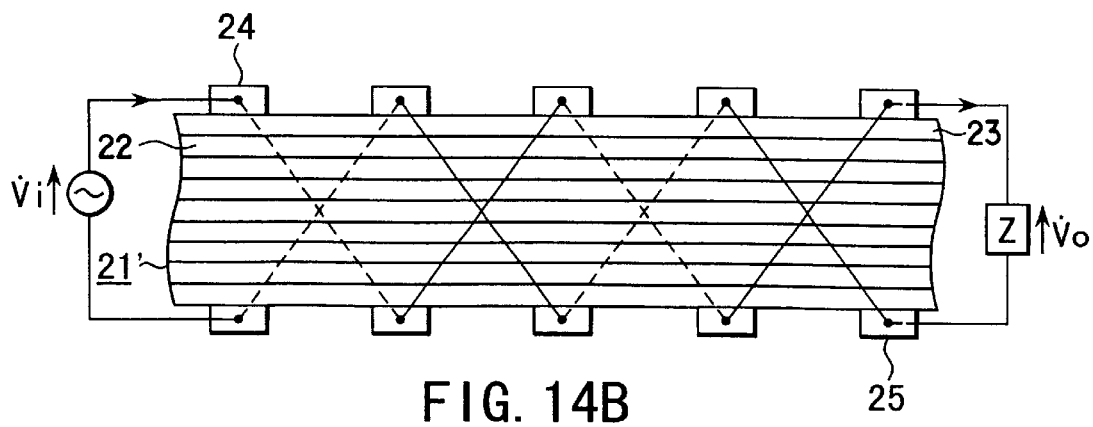
FIG. 14B is a side view of the parallel line type low-pass filter of FIG. 14A.

FIGS. 14A and 14B schematically show the structure of the upper conductor line 24 and lower grounded conductor 25 of the parallel line type low-pass filter. FIG. 14A is a perspective view of the major part of the low-pass filter, while FIG. 14B is a side view thereof. One end of each pattern of the upper conductor line 24 is connected to one of the lower grounded conductors 25 to the left of the conductor 25 which is immediately below the line 24, and the other end of the pattern of the line 24 is connected to one of the conductors 25 to the right of the conductor 25 immediately below, such that respective currents flow through the line 24 and conductor 25 in the same direction and lines 24 and conductors 25 are connected in a spiral configuration. In this case, mutual inductance M of adjacent conductor lines becomes positive; thus, the total line length necessary for acquiring substantially the same characteristics as those of the above-described microstrip line type low-pass filter is equal to about ⅔ of that in the meander pattern, and the element can be miniaturized greatly.

Figure 15A:
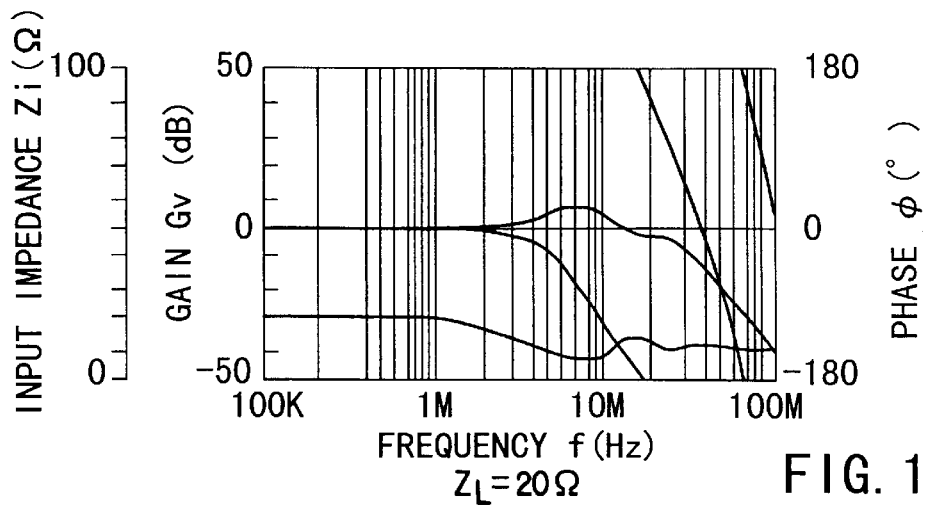
Figure 15B:
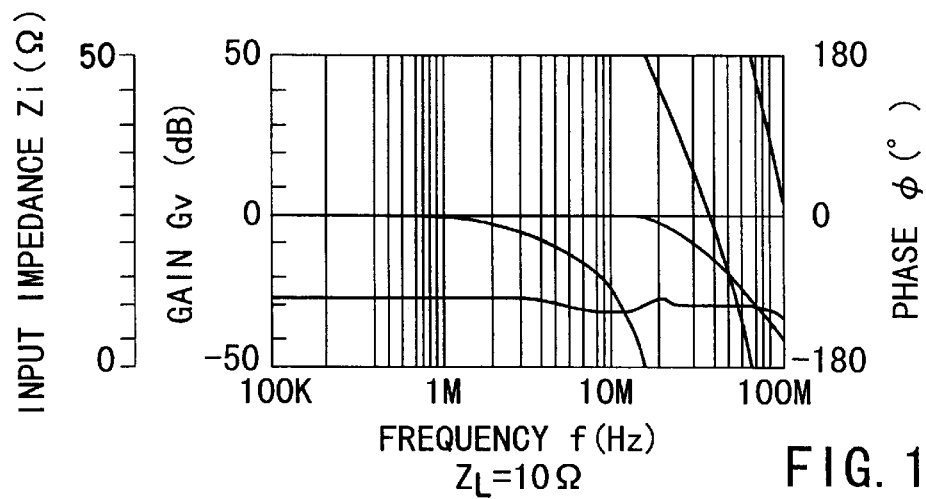
FIG. 15B is a characteristic diagram of a parallel line type low-pass filter using a 10 Ω pure resistance for a load.

FIGS. 15A and 15B show the measured values of input/output voltage gain Gv, phase φ and input impedance Zi obtained by connecting the above parallel line type low-pass filter to a load ($Z_L$). In FIG. 15A, a 20 Ω pure resistance is used for the load and, in FIG. 15B, a pure resistance of 10 Ω is used.

When a load of 20 Ω pure resistance is connected, i.e., when the low-pass filter terminates at 20 Ω, the line length becomes equal to ¼ wavelength at a frequency of about 7 MHz and the input impedance Zi is as low as about 10 Ω and thus the signal is increased. However, in the high-frequency band of 10 MHz or more, the amount of attenuation of the signal is large and the low-pass filter functions normally. On the other hand, when a load of 10 Ω pure resistance is connected, i.e., when the low-pass filter terminates at 10 Ω, a large amount of attenuation of signal can be obtained, irrespective of the strength of the load, in the high-frequency band of 10 MHz or more.

When the parallel line type low-pass filter having the above constitution is applied to an output noise filter of a rectangular wave switching power supply whose operating frequency is 100 KHz, input voltage is 5V, output voltage is 7.2V and output current is 0.5A, spike noise, which could not be eliminated by the normal output capacitor, can be reduced greatly.

More specifically, the self-resonance frequency of normal output capacitor is about 1 MHz, and spike noise having frequency components ranging from several tens of MHz to 100 MHz cannot be removed. In contrast, when the above parallel line type low-pass filter is connected to the output of the power supply, spike noise of about 2V can be reduced to 50 mV or less. Consequently, only the spike noise can effectively be eliminated under the condition of considerably smaller insertion loss (the efficiency is decreased only 0.5%).

Figure 16:
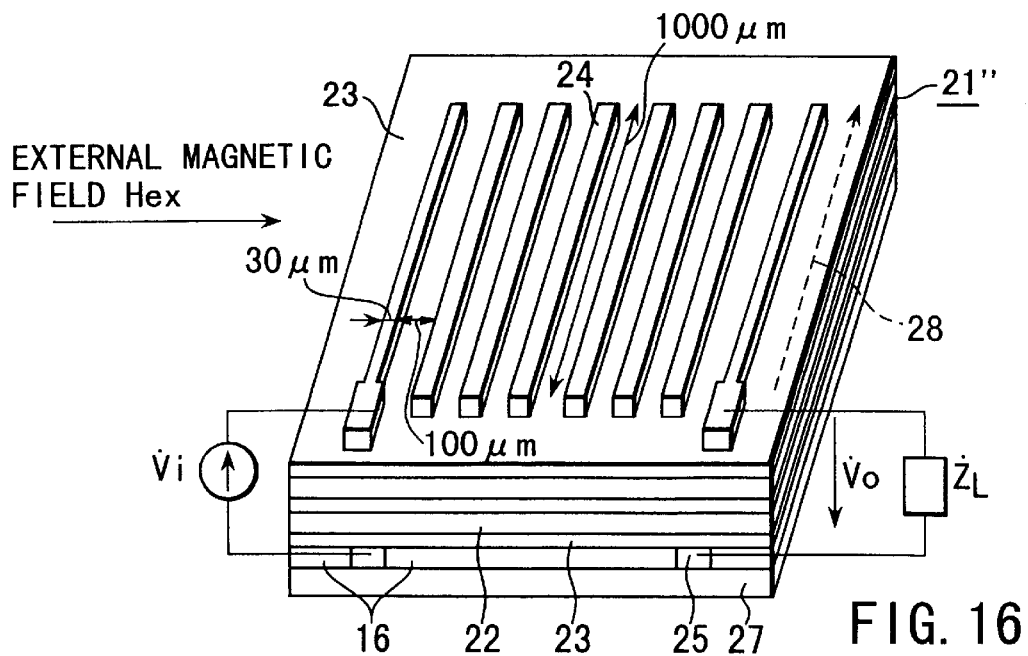
FIG. 16 is a perspective view of a magnetic sensor which is constituted by the parallel line type distributed constant element.

FIG. 16 illustrates a magnetic sensor to which the parallel line type distributed constant element is applied. The structure of the magnetic sensor is basically the same as that of the foregoing microstrip line type magnetic sensor (see FIG. 9), and the structure of the conductor line is similar to that of the parallel line type low-pass filter (see FIG. 13). In the magnetic sensor shown in FIG. 16, a CoZrNb amorphous magnetic film is used as magnetic layers 22 and an $SiO_2$ film is used as dielectric films 23 to constitute a propagation path 21" of an electromagnetic wave. Further, Cu (5 $\mu$m) and Cr (0.1 $\mu$m) are applied to an upper conductor line 24 and a lower grounded conductor 25, respectively, $SiO_2$ is used for dielectric layers 26, and Si is used for an insulative underlying substrate 27. When an external magnetic field Hex is 0, the ¼ wavelength tuning frequency is set to 39 MHz.

In the magnetic layers 22, $t_M$ is 0.5 $\mu$m, $\mu_s'$ is 2000, and N is 2 and, in the dielectric layers 23, $t_D$ is 0.05 $\mu$m and $\epsilon_S$ is 4.

The upper conductor line 24 and lower grounded conductor 25 each have a plurality (eight) of almost I-shaped linear patterns, and the thickness $t_C$ thereof is 5 $\mu$m and the ratio of line width to line spacing is 30 $\mu$m to 100 $\mu$m. The length of the upper conductor line 24 is set to about 1000 $\mu$m.

The upper conductor line 24 and lower grounded conductor 25 are connected to each other substantially in a spiral configuration so as to cause all currents to flow in the same direction (mutual inductance M of adjacent conductor lines is positive). The end (terminal) portions of the lower grounded conductor 25 are drawn out of the front of the inductor so as to be connected to an external device.

Magnetic layers 22 have uniaxial magnetic anisotropy, and their easy magnetization axis 28 is parallel to the longitudinal direction of the upper conductor line 24.

Figure 17:
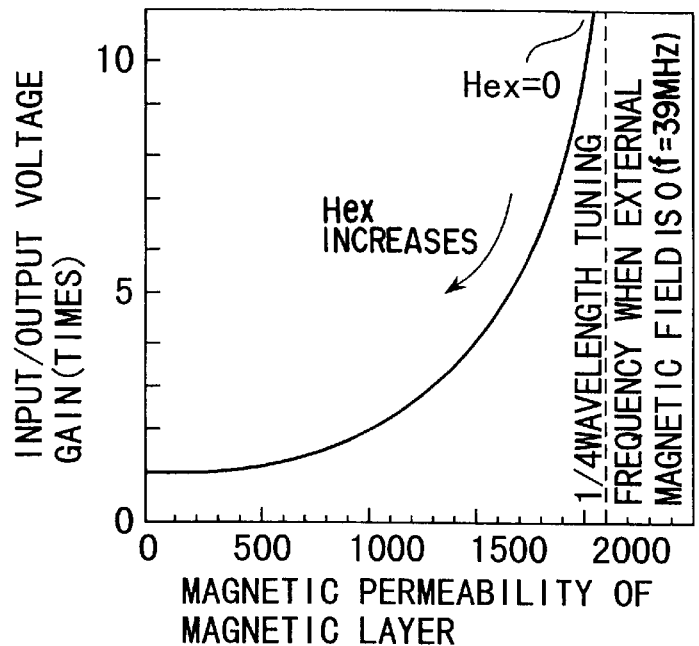
FIG. 17 is a characteristic diagram showing a relationship between the magnetic permeability and terminal voltage of a magnetic layer of the magnetic sensor.

FIG. 17 shows a relationship between magnetic permeability and terminal voltage (input/output voltage gain) of magnetic layers of the above parallel line type magnetic sensor. In this figure, a broken line indicates the magnetic permeability obtained when the external magnetic field Hex is 0 and then the magnetic sensor serves as a ¼ wavelength transformer. If, therefore, the magnetic sensor terminates at 20 KΩ, a gain of 20 dB is obtained. If the magnetic permeability is lowered due to an increase in external magnetic field Hex, the characteristic impedance and wavelength of the line are varied and the terminal voltage is dropped.

Figure 18:
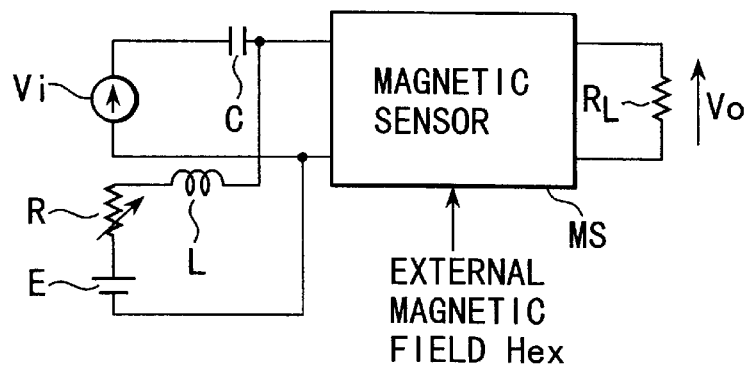
FIG. 18 is a circuit diagram showing a sensor circuit constituted by the magnetic sensor.

FIG. 18 schematically shows the arrangement of a sensor circuit (the whole of a sensor system) for actually operating the magnetic sensor described above. In this sensor circuit, an AC constant-voltage source Vi of 39 MHz is connected to an input terminal of the magnetic sensor MS through a current blocking capacitor C (whose impedance is sufficiently low at 39 MHz). The AC constant-voltage source Vi also terminates at a pure resistance (terminal resistance) $R_L$ of 2 KΩ. Moreover, a DC power supply E for applying an appropriate DC bias magnetic field to the magnetic layers 22 is connected to the input terminal of the magnetic sensor MS through both a DC bias current controlling variable resistance R and an AC blocking coil L (whose impedance is sufficiently high at 39 MHz).

Figure 19:
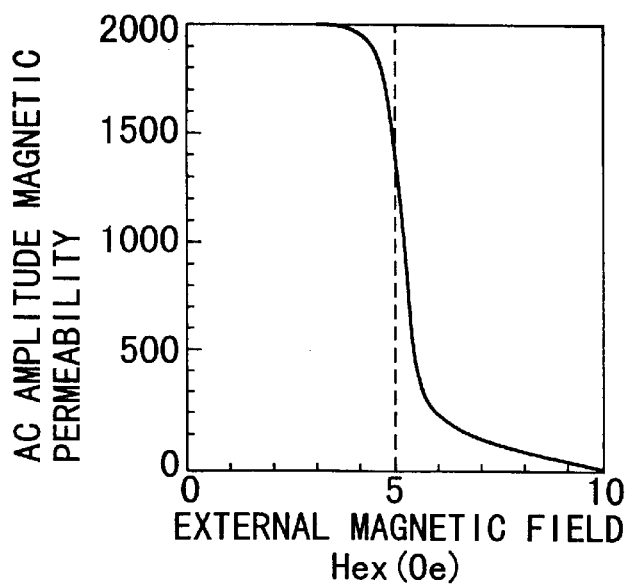
FIG. 19 is a characteristic diagram showing a relationship between the external magnetic field and AC amplitude magnetic permeability of a CoZrNb amorphous magnetic film used as a magnetic layer of the sensor circuit.

FIG. 19 shows a relationship between the external magnetic field Hex and AC amplitude magnetic permeability of a CoZrNb amorphous magnetic film used as the magnetic layers 22. The magnetic permeability of the magnetic layers 22 varies greatly in the vicinity of the external magnetic field of 5 Oe (which corresponds to an anisotropic magnetic field of uniaxial magnetic anisotropy). For this reason, in the sensor circuit shown in FIG. 18, the DC bias magnetic field, which is applied to the magnetic layers 22 by the DC bias current supplied from the DC power supply E, has only to be set to about 5 Oe. Actually, the external magnetic field Hex and terminal voltage need to be linear and thus the DC bias current is controlled appropriately in consideration of the linearity.

Figure 20:
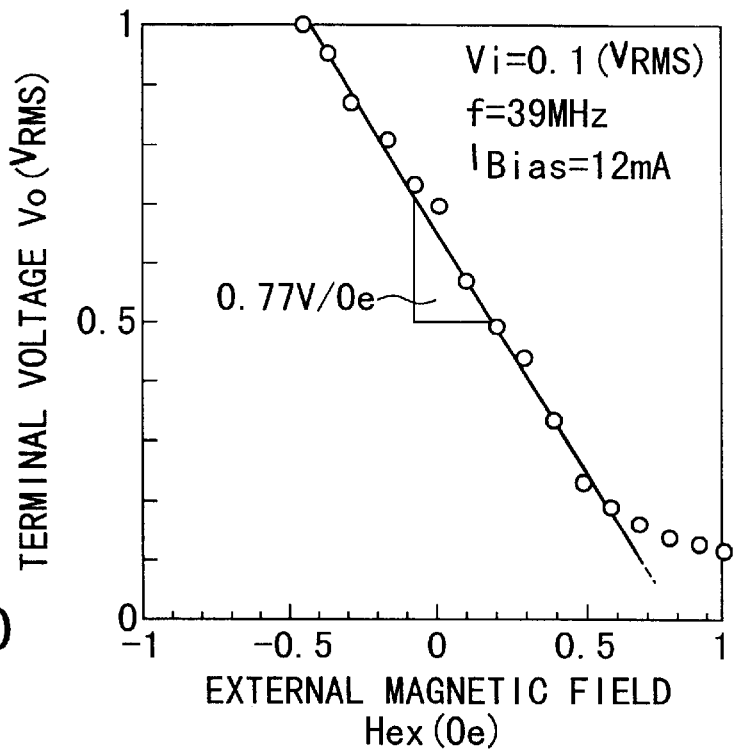
FIG. 20 is a characteristic diagram showing a relationship between the external magnetic field and terminal voltage of the magnetic sensor.

FIG. 20 shows a relationship between the external magnetic field Hex and terminal voltage Vo of the magnetic sensor having the above constitution. In this sensor, the output voltage of AC constant-voltage source Vi of 39 MHz is set to 100 mVRMS, and the DC bias current supplied from the DC power supply E is set to 12 mA. It is apparent from FIG. 20 that the relationship between the external magnetic field Hex and terminal voltage Vo is almost linear. In this case, the magnetic field sensitivity is 0.77 V/Oe.

The structure of the above magnetic sensor can be simplified, as can be that of its peripheral circuit. Consequently, the entire sensor system can easily be miniaturized.

Even when the direction in which the external magnetic field Hex is applied is parallel with the easy magnetization axis 28 of the magnetic layers 22, the magnetic field can be sensed.

(Third Embodiment)

Figure 21:
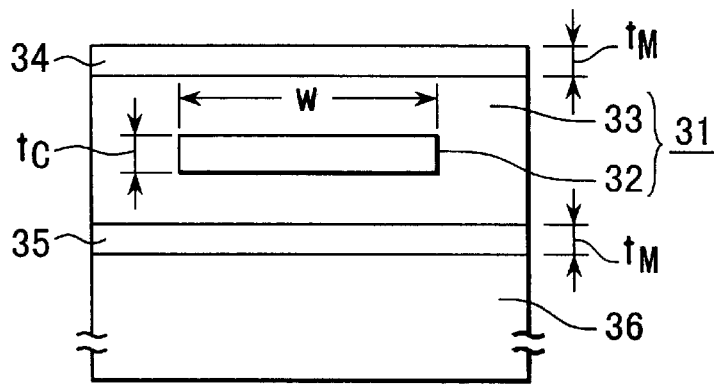
FIG. 21 is a view of the fundamental structure of an internal conductor line type distributed constant element according to a third embodiment of the present invention.

FIG. 21 schematically shows the fundamental structure of an inner conductor line type distributed constant element according to a third embodiment of the present invention. The distributed constant element includes a propagation path 31 of an electromagnetic wave in which an inner conductor line (conductor layer) 32 is surrounded and covered with a dielectric layer 33. An upper magnetic layer (upper soft magnetic metal layer) 34 is provided on the top surface of the propagation path 31, and a lower magnetic layer (lower soft magnetic metal layer) 35 is formed on the bottom surface of the propagation path 31. The distributed constant element is thus formed on an insulative underlying substrate 36 with the lower magnetic layer 35 interposed therebetween.

The upper magnetic layer 34 and lower magnetic layer 35 have a thickness of $t_M$, as in the case of the above microstrip line type or parallel line type distributed constant element. Layers 22 and 23 have substantially the same width. Furthermore, the layers 34 and 35 are electrically connected to each other to constitute a three-terminal element.

Upper and lower magnetic layers 34 and 35 may have uniaxial magnetic anisotropy when the need arises.

The inner conductor line 32 has a thickness $t_C$ and a conductor width w which is narrower than that of each of the layers 33, 34 and 35. The inner conductor line 32 is located almost halfway between the upper and lower magnetic layers 34 and 35.

Though not described in detail, the characteristic impedance $Z_C$ and propagation constant $\gamma$ in the inner conductor line type distributed constant element can easily be calculated by obtaining each of distributed constants.

Figure 22:
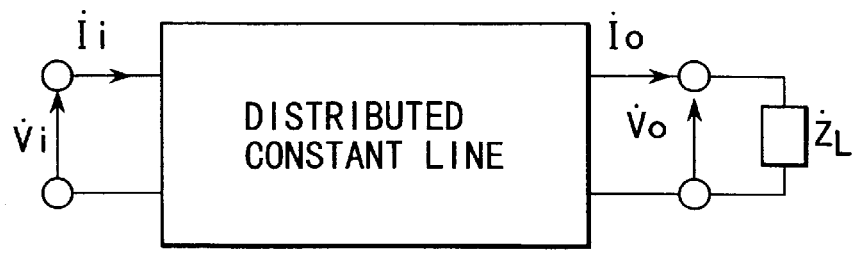
FIG. 22 is a circuit diagram of a line of the internal conductor line type distributed constant element which is constituted by a two-terminal circuit.

The line of the inner conductor line type distributed constant element can be analyzed as a pair of two-terminal circuits as illustrated in FIG. 22.

The transmission characteristic of the pair of two-terminal circuits is expressed as follows using a transmission matrix:

$$\begin{bmatrix} \dot{V}_i \\ \dot{I}_i \end{bmatrix} = \begin{bmatrix} \cosh(\dot{\gamma}l) & \dot{Z}_c \sinh(\dot{\gamma}l) \\ (1/\dot{Z}_c)\sinh & \cosh(\dot{\gamma}l) \end{bmatrix} \begin{bmatrix} \dot{V}_o \\ \dot{I}_o \end{bmatrix} \quad (12)$$

where l is a line length. In equation (12); when the line terminates at impedance $Z_L$, input/output voltage gain $\dot{G}_v$ (=$V_O/V_i$) and input impedance $Z_i$ are given by the following equations:

$$\dot{G}_v = \frac{1}{\cosh(\dot{\gamma}l) + (\dot{Z}_c/\dot{Z}_L)\sinh(\dot{\gamma}l)} \quad (13)$$

$$\dot{Z}_i = \frac{\dot{Z}_L \cosh(\dot{\gamma}l) + \dot{Z}_c \sinh(\dot{\gamma}l)}{(\dot{Z}_L/\dot{Z}_c)\sinh(\dot{\gamma}l) + \cosh(\dot{\gamma}l)} \quad (14)$$

When the terminal of the line is short-circuited, the impedance $Z_i$ on the input side is inductive until the line wavelength is reduced to ¼, and equivalent series inductance $L_s$ and performance index Q are given by the following equations:

$$L_s = \frac{1}{2\omega} \frac{R_c \sin(2\beta l) - X_c \sinh(2\alpha l)}{\cosh^2(\alpha l) - \sin^2(\beta l)} \quad (15)$$

$$Q = \frac{R_c \sin(2\beta l) - X_c \sinh(2\alpha l)}{R_c \sinh(2\alpha l) + X_c \sin(2\beta l)} \quad (16)$$

It is expected that the inner conductor line distributed constant element having electrically grounded magnetic layers 34 and 35 outside the inner conductor line 32 will be applied to a ¼ wavelength transformer, a terminal short-circuit inductor, a low-pass filter and a magnetic sensor. However, this inner conductor line distributed constant element cannot be used at high frequency since an eddy current is generated due to an inter linkage of vertical magnetic flux and inner conductor line 32, and inductance is lowered at high frequency due to an interruption of eddy current. On the other hand, it is useful at low frequency since distributed inductance can be increased.

Figure 23A:
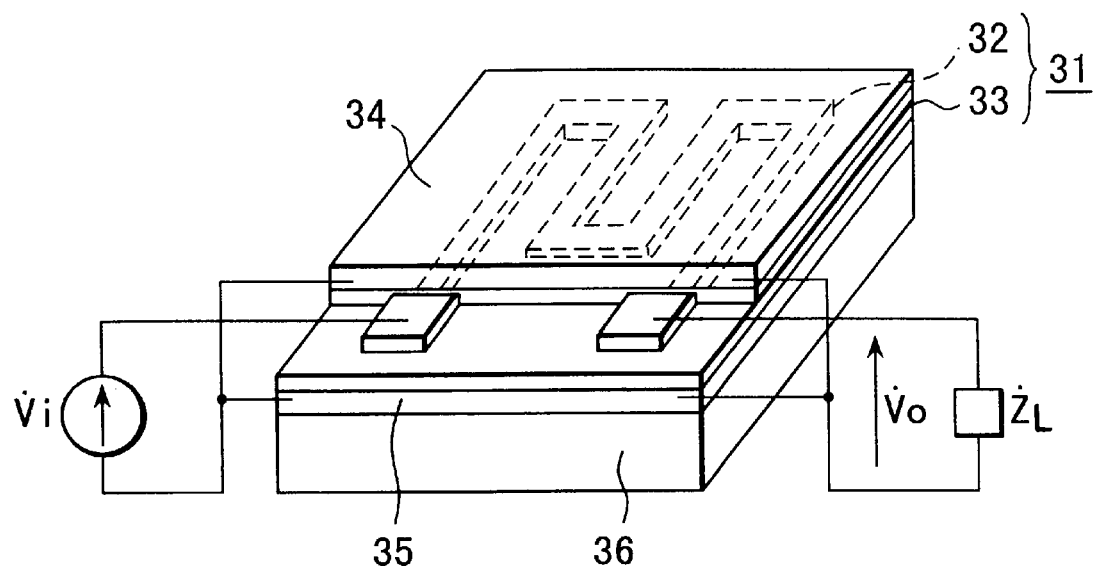
FIG. 23A is a perspective view of an internal conductor line type distributed constant element which is applied to a ¼ wavelength transformer whose internal conductor line has a meander pattern.
Figure 23B:
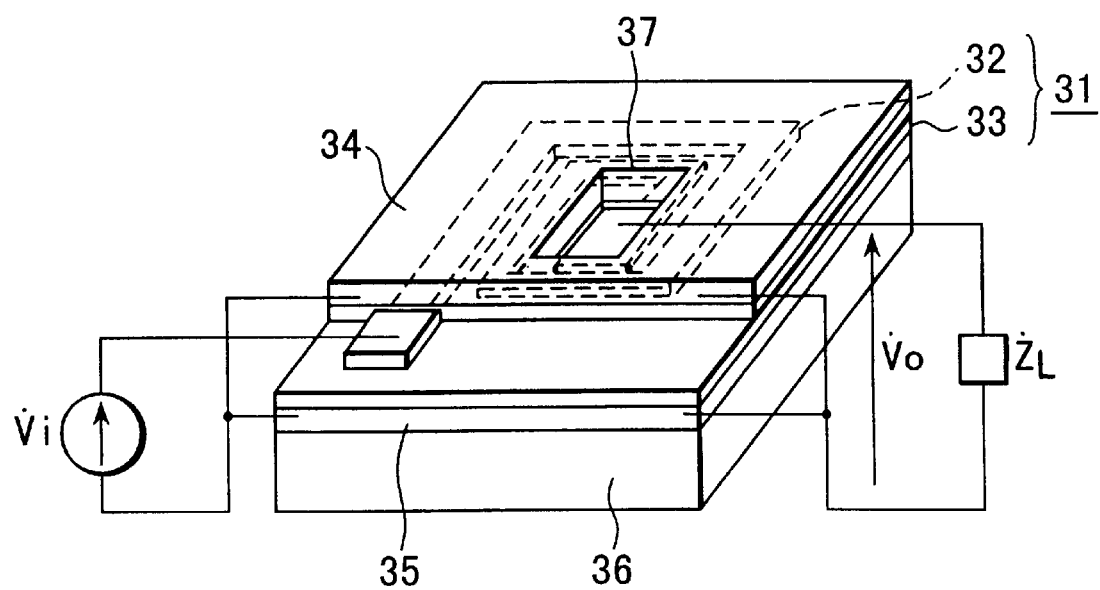
FIG. 23B is a perspective view of the internal conductor line type distributed constant element which is applied to a ¼ wavelength transformer whose internal conductor line has a spiral pattern.

FIGS. 23A and 23B illustrate a ¼ wavelength transformer constituted by the inner conductor line type distributed constant element. FIG. 23A is directed to the inner conductor line 32 having a meander pattern, while FIG. 23B is directed to an inner conductor line 32 having a spiral pattern. When the inner conductor line 32 is formed spirally, an opening is formed in the upper magnetic layer 34 and the dielectric layer 33 on the upper magnetic layer side. One end of the spiral pattern has only to be exposed outside through the opening 37.

Various structures of the distributed constant element of the present invention have been described. However, the pattern of the conductive line is not limited to a meander pattern. In the microstrip line type and parallel line type distributed constant elements, if a distance (d') between upper and lower conductive lines is considerably smaller than the conductor width (w) of each of the conductor lines, more specifically, if the relationship between d' and w is set to w/d'≧5, favorably w/d'≧10, good characteristics can be obtained.

In the microstrip line type and parallel line type distributed constant elements, the magnetic layer functions as an electrode of distributed capacitance. In the inner conductor line type distributed constant element, the magnetic layer serves as a grounded layer and thus a lower resistance is satisfactory. However, it makes little matter if the upper limit of the resistance is several hundreds of $\mu\Omega$·cm, and magnetic metal materials such as crystalline, amorphous and crystallite can be used.

It is needless to say that various changes and modifications can be made without departing from the scope of the subject matter of the present invention.

According to the present invention as described above in detail, a transmission line can be constituted by the distributed constants (distributed inductance, distributed capacitance and distributed loss resistance). Thus, the wavelength (line length) of a propagation path of electromagnetic wave can be shortened. Consequently, in accordance with the development and practicability of various types of magnetic thin-film devices, the devices can be rapidly improved in characteristics (performance), decreased in size (thickness) and reduced in manufacturing costs.

Additional advantages and modifications will readily occurs to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A distributed constant element comprising:
   soft magnetic metal layers;
   dielectric layers provided so as to sandwich each of the soft magnetic metal layers from above and below; and
   conductors provided above and below the soft magnetic metal layers having each of the dielectric layers therebetween.

2. A device as recited in claim 1, wherein:
   said soft magnetic layers and dielectric layers form a stack; and
   said conductor layers are disposed above and below said stack.

3. The distributed constant element according to claim 1, wherein the soft magnetic metal layer and the dielectric layer are formed one on another to constitute a propagation path of electromagnetic wave.

4. The distributed constant element according to claim 1, wherein at least one of the conductor layers, which is formed above the soft magnetic metal layer, has a meander pattern.

5. The distributed constant element according to claim 1, wherein uniaxial magnetic anisotropy is induced to the soft magnetic metal layer.

6. The distributed constant element according to claim 5, wherein the soft magnetic metal layer and the dielectric layer are formed one on another to constitute a propagation path of electromagnetic wave.

7. The distributed constant element according to claim 5, wherein at least one of the conductor layers, which is formed above the soft magnetic metal layer, has a meander pattern.

8. A distributed constant element comprising:

a soft magnetic metal layer; and conductor layers provided so as to sandwich the soft magnetic metal layer, a dielectric layer being interposed between the soft magnetic metal layer and each of the conductor layers, wherein the conductor layers have substantially the same meander pattern.

9. A distributed constant element comprising:

a soft magnetic metal layer; and conductor layers provided so as to sandwich the soft magnetic metal layer, a dielectric layer being interposed between the soft magnetic metal layer and each of the conductor layers, wherein each of the conductor layers has a plurality of linear pattern portions, and the linear pattern portions are connected to each other so as to cause all currents to flow in a same direction in the linear pattern portions for a given one of said conductor layers.

10. The distributed constant element according to claim 9, wherein the linear pattern portions of each of the conductor layers are connected to each other substantially in a spiral.

11. A distributed constant element comprising:

a soft magnetic metal layer; and conductor layers provided so as to sandwich the soft magnetic metal layer, a dielectric layer being interposed between the soft magnetic metal layer and each of the conductor layers, wherein uniaxial magnetic anisotropy is induced to the soft magnetic metal layer, and the conductor layers have substantially the same meander pattern.

12. A distributed constant element comprising:

a soft magnetic metal layer; and conductor layers provided so as to sandwich the soft magnetic metal layer, a dielectric layer being interposed between the soft magnetic metal layer and each of the conductor layers, wherein uniaxial magnetic anisotropy is induced to the soft magnetic metal layer, and each of the conductor layers has a plurality of linear pattern portions, and the linear pattern portions are connected to each other so as to cause all currents to flow in the same direction in the linear pattern portions for a given one of said conductor layers.

13. The distributed constant element according to claim 12, wherein the linear pattern portions of each of the conductor layers are connected to each other substantially in a spiral.

14. A distributed element constant device comprising:

an upper conductor;

a lower conductor; and a plurality of alternating magnetic and dielectric layers disposed between said upper and lower conductors, wherein said magnetic layers comprise FeSmZr;

said dielectric layers comprise $SiO_2$;

said device comprises a line type distributed constant device; and said device is configured as a terminal short-circuit inductor.

15. A distributed element constant device comprising:

an upper conductor;

a lower conductor; and a plurality of alternating magnetic and dielectric layers disposed between said upper and lower conductors, wherein said device comprises a line type distributed constant device;

said device is configured as a terminal short-circuit inductor; and said upper conductor has a substantially u-shaped pattern.

16. A distributed element constant device comprising:

an upper conductor;

a lower conductor; and a plurality of alternating magnetic and dielectric layers disposed between said upper and lower conductors, wherein said device comprises a line type distributed constant device; and said device is configured as a low-pass filter.

17. A device as recited in claim 16, wherein:

said magnetic layers comprise FeCoBC; and said dielectric layers comprise AlN.

18. A device as recited in claim 16, comprising:

said upper conductor having a substantially w-shaped pattern.

19. A distributed element constant device comprising:

an upper conductor;

a lower conductor; and a plurality of alternating magnetic and dielectric layers disposed between said upper and lower conductors, wherein said magnetic layers comprise CoZrNb; and said dielectric layers comprise $SiO_2$.

20. A device as recited in claim 19, wherein said device comprises a line type distributed constant device; and said device is configured as a magnetic sensor.

21. A microstrip line type distributed constant element comprising:

a lower conductor layer provided on an insulative substrate;

a soft magnetic metal layer formed on the lower conductor layer with a dielectric layer interposed therebetween, uniaxial magnetic anisotropy is induced to the soft magnetic metal layer; and an upper conductor layer formed on the soft magnetic metal layer with a dielectric layer interposed therebetween.

22. The microstrip line type distributed constant element according to claim 21, wherein the soft magnetic metal layer and the dielectric layer are formed one on another to constitute a propagation path of electromagnetic wave.

23. The microstrip line type distributed constant element according to claim 21, wherein the upper conductor layer has a meander pattern.

24. The microstrip line type distributed constant element according to claim 21, by which a transmission line type transformer is constituted when a line length is equal to about ¼ of a wavelength of electro-magnetic wave.

25. The microstrip line type distributed constant element according to claim 24, by which a magnetic sensor is constituted, the magnetic sensor terminating at a high resistance and sensing a variation in magnetic permeability of the soft magnetic metal layer due to an external magnetic field, as a variation in amplitude of terminal voltage.

26. The microstrip line type distributed constant element according to claim 21, by which a transmission line type inductance element is constituted when a line length is considerably shorter than ¼ of a wavelength of electromagnetic wave and one end of the upper conductor layer is electrically connected to the lower conductor layer.

27. The microstrip line type distributed constant element according to claim 21, by which a low-pass filter is constituted using magnetic metal, which increases in loss at a high frequency, for the soft magnetic metal layer.

28. A parallel line type distributed constant element comprising:
   a lower conductor layer provided on an insulative substrate;
   a soft magnetic metal layer formed on the lower conductor layer with a dielectric layer interposed therebetween, uniaxial magnetic anisotropy is induced to the soft magnetic metal layer; and
   an upper conductor layer formed on the soft magnetic metal layer with a dielectric layer interposed therebetween and having substantially the same shape as that of the lower conductor layer.

29. The parallel line type distributed constant element according to claim 28, wherein the soft magnetic metal layer and the dielectric layer are formed one on another to constitute a propagation path of electromagnetic wave.

30. The parallel line type distributed constant element according to claim 28, wherein the upper conductor layer and the lower conductor layer each have a meander pattern.

31. The parallel line type distributed constant element according to claim 28, wherein each of the upper conductor layer and the lower conductor layer has a plurality of linear pattern portions, and the linear pattern portions are connected to each other so as to cause all currents to flow in the same direction in the linear pattern portions for a given one of said conductor layers.

32. The parallel line type distributed constant element according to claim 31, wherein the linear pattern portions of each of the upper conductor layer and the lower conductor layer are connected to each other substantially in a spiral.

33. The parallel line type distributed constant element according to claim 28, by which a transmission line type transformer is constituted when a line length is equal to about ¼ of a wavelength of electromagnetic wave.

34. The parallel line type distributed constant element according to claim 33, by which a magnetic sensor is constituted, the magnetic sensor terminating at a high resistance, and sensing a variation in magnetic permeability of the soft magnetic metal layer due to an external magnetic field, as a variation in amplitude of terminal voltage.

35. The parallel line type distributed constant element according to claim 28, by which a transmission line type inductance element is constituted when a line length is considerably shorter than ¼ of a wavelength of electromagnetic wave and one end of the upper conductor layer is electrically connected to the lower conductor layer.

36. The parallel line type distributed constant element according to claim 28, by which a low-pass filter is constituted using magnetic metal, which increases in loss at a high frequency, for the soft magnetic metal layer.

37. A distributed element constant device comprising:
   an upper conductor;
   a lower conductor; and
   a plurality of alternating magnetic and dielectric layers disposed between said upper and lower conductors,
   wherein an inductance per unit length of said upper conductor is given by:

$$L = 2A\left(\ln\left(\frac{2l}{w+t_c}\right) + 0.2505 + \frac{w+t_c}{3l}\right) \times 10^{-7}$$

where:
   l is a line length of said upper line,
   A is a quantity having a value greater than 1 but less than 2, and varies
   with a thickness of said soft magnetic layer,
   w is a width of said upper line, and
   $t_c$ is a thickness of said upper line.

38. A distributed element constant device comprising:
   an upper conductor;
   a lower conductor; and
   a plurality of alternating magnetic and dielectric layers disposed between said upper and lower conductors,
   wherein a wavelength λ of an electromagnetic wave propagating though said layers is given as:

$$\lambda = \frac{1}{f\sqrt{2A\left(\ln\left(\frac{2l}{w+t_c}\right) + 0.2505 + \frac{w+t_c}{3l}\right)\varepsilon \frac{w}{(N+1)t_D} \times 10^{-7}}}$$

where:
   l is a line length of said upper line,
   A is a quantity having a value greater than 1 but less than 2, and varies
   with a thickness of said soft magnetic layer,
   w is a width of said upper line,
   $t_c$ is a thickness of said upper line,
   ε is a dielectric constant of said dielectric layers,
   N is a number of said magnetic layers, and
   $t_D$ is a thickness of said dielectric layers.

39. A distributed element constant device comprising:
   an upper conductor;
   a lower conductor; and
   a plurality of alternating magnetic and dielectric layers disposed between said upper and lower conductors, wherein
   said magnetic layer comprises FeSmZr; and
   said dielectric layer comprises $SiO_2$.

40. A device as recited in claim 39, comprising:
   a thickness of said magnetic layer and said dielectric layer being approximately 0.2 μm.

41. A device as recited in claim 39, wherein
   said device comprises a line type distributed constant device; and
   said device is configured as a terminal short-circuit inductor.

42. A distributed element constant device comprising:
   an upper conductor;
   a lower conductor; and
   a plurality of alternating magnetic and dielectric layers disposed between said upper and lower conductors,
   wherein said upper conductor has a meandering pattern substantially w-shaped.

43. A distributed element constant device comprising:
   an upper conductor;
   a lower conductor; and a plurality of alternating magnetic and dielectric layers disposed between said upper and lower conductors, said upper and lower conductors having substantially the same pattern and shape.

44. A device as recited in claim 43, wherein:

said upper and lower conductors comprise a plurality of linear pattern elements; and said elements are connected in a spiral pattern such that current flows in a first direction in each of linear pattern elements comprising said upper conductor and flows in a second direction in each of linear pattern elements comprising said lower conductor.

45. A distributed element constant device comprising:

an upper conductor;

a lower conductor; and a plurality of magnetic layers and a plurality of dielectric layers disposed alternatingly between said upper and lower conductors.

46. A device as recited in claim 45, wherein said device comprises a line type distributed constant device; and said device is configured as a ¼ wave transformer.

47. A device as recited in claim 45, wherein said device comprises a line type distributed constant device; and said device is configured as a terminal short-circuit inductor.

48. A device as recited in claim 45, comprising:

said magnetic layer having uniaxial magnetic anisotropy.

49. A device as recited in claim 45, comprising:

said magnetic layer having an easy axis of magnetization in a direction substantially parallel to a longitudinal direction of said upper conductor.

50. A device as recited in claim 45, wherein said magnetic layer comprises a soft magnetic material.

51. A device as recited in claim 45, wherein said device comprises a line type distributed constant device; and said device is configured as a magnetic sensor.

52. A device as recited in claim 51, comprising:

said upper conductor having a meander pattern.

53. A device as recited in claim 45, wherein said upper conductor has a meandering pattern.

54. A device as recited in claim 53, wherein said pattern is substantially u-shaped.

55. A device as recited in claim 45, wherein:

said plurality of soft magnetic layers and said plurality of dielectric layers form a stack; and said conductor layers are disposed above and below said stack.

56. A device as recited in claim 45, wherein said magnetic layers comprise a magnetic flux shield between said upper and lower conductors.

* * * * *